United States Patent [19]

Itabashi et al.

[11] Patent Number: 5,327,003
[45] Date of Patent: Jul. 5, 1994

[54] SEMICONDUCTOR STATIC RAM HAVING THIN FILM TRANSISTOR GATE CONNECTION

[75] Inventors: Kazuo Itabashi; Taiji Ema, both of Kawasaki, Japan

[73] Assignee: Fujitsu Limited, Kawasaki, Japan

[21] Appl. No.: 5,186

[22] Filed: Jan. 15, 1993

Related U.S. Application Data

[63] Continuation of Ser. No. 846,829, Mar. 6, 1992, abandoned.

[30] Foreign Application Priority Data

Mar. 8, 1991 [JP] Japan ................................. 3-067707
Jun. 18, 1991 [JP] Japan ................................. 3-145940

[51] Int. Cl.$^5$ ........................................... H01L 27/02
[52] U.S. Cl. ................................... 257/385; 257/67; 257/393; 257/903
[58] Field of Search ................ 357/59 E, 42, 71, 23.7, 357/41, 904; 257/67, 393, 903, 385

[56] References Cited

U.S. PATENT DOCUMENTS

| | | | |
|---|---|---|---|
| 4,764,801 | 8/1988 | McLaughlin et al. | 257/588 |
| 4,931,410 | 6/1990 | Tokunaga et al. | 437/189 |
| 5,028,975 | 7/1991 | Nagasawa et al. | 357/41 |
| 5,034,797 | 7/1991 | Yamanaka et al. | 257/904 |
| 5,210,429 | 5/1993 | Adan | 257/67 |

FOREIGN PATENT DOCUMENTS

| | | | |
|---|---|---|---|
| 59-231851 | 12/1984 | Japan | 357/23.6 |
| 62-203363 | 9/1987 | Japan | . |
| 64-82559 | 6/1989 | Japan | . |
| 1-1446556 | 6/1989 | Japan | . |
| 2-312271 | 12/1990 | Japan | . |

OTHER PUBLICATIONS

Yamanaka et al., "A 25 μm² New Poly-Si PMOS Load (PPL) SRAM Cell Having Excellent Soft Error Immunity," *International Electron Devices Meeting*, Dec. 1988, San Francisco, Calif., pp. 48–51.

Ishibashi et al., "An α-Immune, 2-V Supply Voltage SRAM Using a Polysilicon PMOS Load Cell," *IEEE Journal of Solid-State Circuits*, vol. 25, No. 1, Feb. 1990, New York, N.Y., pp. 55–60.

Adan et al., "A Half-Micron SRAM Cell Using a Double-Gated Self-Aligned Polysilicon PMOS Thin Film Transistor (TFT) Load," *Symposium on VLSI Technology*, Jun. 1990, Honolulu, Japan, pp. 19–20.

*Primary Examiner*—Robert Limanek
*Attorney, Agent, or Firm*—Staas & Halsey

[57] ABSTRACT

A semiconductor memory device includes a semiconductor substrate, a memory cell provided on the semiconductor substrate and including first and second transfer transistors, first and second driver transistors and first and second thin film transistor loads, where each of the first and second transfer transistors, the first and second driver transistors and the first and second thin film transistor loads have a source, a drain and a gate electrode, and a connecting region in which the drain of the second thin film transistor load, the gate electrode of the first thin film transistor load and the gate electrode of the first driver transistor are connected. The gate electrode of the first driver transistor, the gate electrode of the first thin film transistor load and the drain of the second thin film transistor load are made of conductor layers which are stacked on the semiconductor substrate with an insulator layer interposed between the conductor layers, and a top one of the stacked conductor layers makes contact with a top surface of a bottom one of the stacked conductor layers and with side surfaces of each conductor layer provided between the top and bottom conductor layers within the connecting region.

21 Claims, 52 Drawing Sheets

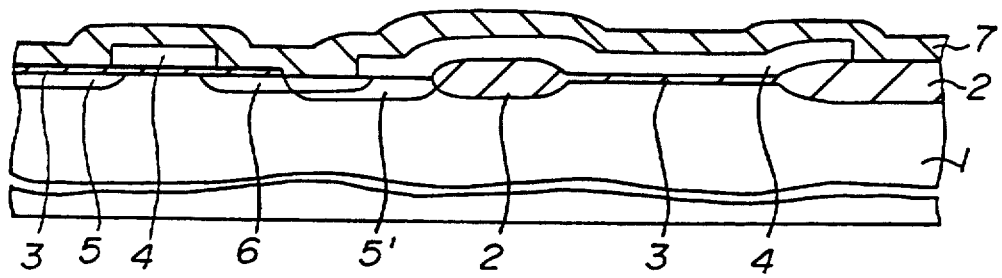
FIG. IE PRIOR ART

FIG. IF PRIOR ART
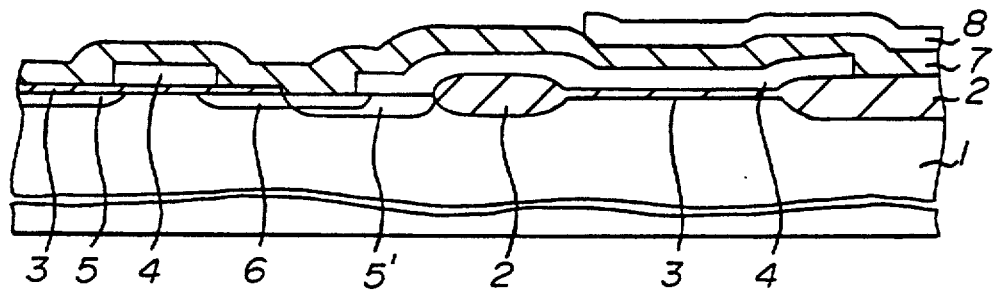

BL   /BL

SEMICONDUCTOR STATIC RAM HAVING THIN FILM TRANSISTOR GATE CONNECTION

This application is a continuation of application Ser. No. 07/846,829, filed Mar. 6, 1992 now abandoned.

BACKGROUND OF THE INVENTION

The present invention generally relates to semiconductor memory devices and methods of producing the same, and more particularly to a thin film transistor (TFT) load type static random access memory (SRAM) and a method of producing such a TFT load type SRAM.

Up to now, the high resistance load type SRAM was popularly used. However, as the integration density improves and the number of memory cells increases, the current consumption increases and various problems are generated. In order to avoid such problems and the help of the progress in the semiconductor technology, the SRAM having the TFT load has been realized. However, new problems are generated due to the use of the TFT load, and it is necessary to eliminate these new problems.

An example of a conventional method of producing the high resistance load type SRAM will be described with reference to FIGS.1A through 1J and FIGS. 2A through 2F. FIGS. 1A through 1J are side views in cross section showing essential parts of the high resistance load type SRAM at essential stages of the conventional method of producing the high resistance load type SRAM. FIGS. 2A through 2F are plan views of the high resistance load type SRAM at essential stages of the conventional method of producing the high resistance load type SRAM. FIGS.1A through 1J respectively are cross sections taken along a line which corresponds to a line Y—Y in the plan view of FIG.2F.

In FIG.1A, a silicon dioxide ($SiO_2$) layer is used as a pad layer, for example, and a silicon nitride ($Si_3N_4$) layer which is formed on the $SiO_2$ layer is used as an oxidation resistant mask layer when carrying out a selective thermal oxidation (for example, a local oxidation of silicon (LOCOS)) so as to form a field insulator layer 2 on a silicon (Si) semiconductor substrate 1. This field insulator layer 2 is made of $SiO_2$ and has a thickness of 4000 Å, for example.

Then, the $Si_3N_4$ layer and the $SiO_2$ layer which are used when carrying out the selective thermal oxidation are removed to expose an active region of the Si semiconductor substrate 1.

In FIG.1B, a thermal oxidation is carried out to form a gate insulator layer 3 which is made of $SiO_2$ and has a thickness of 100 Å, for example.

By carrying out a resist process of the photolithography technique and a wet etching using hydrofluoric acid as the etchant, the gate insulator layer 3 is selectively etched to form a contact hole 3A.

In FIGS.1C and 2A, a chemical vapor deposition (CVD) is carried out to form a first polysilicon layer having a thickness of 1500 Å, for example.

Then, a vapor phase diffusion is carried out to introduce phosphorus (P) of $1\times10^{20}$ cm$^{-3}$, for example, so as to form an n$^+$-type impurity region 5'.

In FIG.2A, the illustration of the first polysilicon layer is omitted for the sake of convenience.

In FIG.1D, a resist process of the photolithography technique and a reactive ion etching (RIE) using $CCl_4/O_2$ as the etching gas are carried out to pattern the first polysilicon layer and form a gate electrode 4. The gate electrode 4 becomes the gate electrode of a word line and a driver transistor.

An ion implantation is carried out to inject As ions with a dosage of $3\times10^{15}$ cm$^{-2}$ and an acceleration energy of 40 keV, so as to form a source region 5 and a drain region 6.

In FIGS.1E and 2B, a CVD is carried out to form an insulator layer 7 which is made of $SiO_2$ and has a thickness of 1000 Å, for example.

By carrying out a resist process of the photolithography technique and a RIE using $CHF_3$/He as the etching gas, a ground line contact hole 7A is formed. This ground line contact hole 7A cannot be seen in FIG.1E.

In FIG.1F, a CVD is carried out to form a second polysilicon layer having a thickness of 1500 Å, for example.

Then, an ion implantation is carried out to inject P ions into the second polysilicon layer with a dosage of $4\times10^{15}$ cm$^{-2}$ and an acceleration energy of 30 keV, and an annealing is carried out to reduce the resistance.

A resist process of the photolithography technique and a RIE using $CCl_4/O_2$ as the etching gas are carried out to pattern the second polysilicon layer and form a ground line 8.

In FIGS.1G and 2C, a CVD is carried out to form an insulator layer 9 which is made of $SiO_2$ and has a thickness of 1000 Å, for example.

A resist process of the photolithography technique and a RIE using $CHF_3$/He as the etching gas are carried out to selectively etch the insulator layers 9 and 7 and form a load resistor contact hole 9A.

In FIG.1H, a CVD is carried out to form a third polysilicon layer having a thickness of 1500 Å, for example.

A resist process of the photolithography technique and an ion implantation with a dosage of $1\times10^{15}$ cm$^{-2}$ and an acceleration energy of 30 keV are carried out to inject As ions into a part where a supply line of a positive power source voltage Vcc is formed and a part where the high resistance load makes contact with the gate electrode 4.

By carrying out a resist process of the photolithography technique and a RIE using $CCl_4/O_2$ as the etching gas, the third polysilicon layer is patterned to form a contact part 10, a high resistance load 11 and a Vcc supply line 12.

In FIGS.1I and 2D, a CVD is carried out to form an insulator layer which is made of $SiO_2$ and has a thickness of 1000 Å, for example, and an insulator layer which is made of phosphosilicate glass (PSG) and has a thickness of 5000 Å, for example. In FIG.1I, these insulator layers are referred to as an insulator layer 13.

A thermal process is thereafter carried out to reflow and planarize the insulator layer 13.

Next, a resist process of the photolithography technique and a RIE using $CHF_3$/He as the etching gas are carried out to selectively etch the insulator layer 13 and the like and to form a bit line contact hole 13A.

In FIGS.1J and 2E, a sputtering is carried out to form an aluminum (Al) layer having a thickness of 1 μm, for example. This Al layer is patterned using the normal photolithography technique so as to form a bit line 14. Those elements which are shown in FIGS.1J and 2E but not yet described, such as "BL", will be readily understood from the description given later in conjunction with FIG.3.

FIG.2F shows the plan view of the essential part of the high resistance load type SRAM which is completed by the above described processes. In FIG.2F, those parts which are the same as those corresponding parts in FIGS.1A through 1J and FIGS.2A through 2E are designated by the same reference numerals. However, for the sake of convenience, the illustration of the Al bit line 14 shown in FIGS.1J and 2E is omitted in FIG.2F.

FIG.3 shows an equivalent circuit diagram of the essential part of the high resistance load type SRAM described above in conjunction with FIGS.1A through 1J and 2A through 2F.

FIG.3 shows driver transistors Q1 and Q2, transfer gate transistors Q3 and Q4, high resistance loads R1 and R2, a word line WL, bit lines BL and BL, nodes S1 and S2, the positive power source voltage Vcc, and a negative power source voltage Vss.

The operation of this high resistance load type SRAM, the storage operation in particular, is carried out as follows.

If it is assumed that the positive power source voltage Vcc is 5 V, the negative power source voltage Vss is 0 V, the node S1 is 5 V and the node S2 is 0V, the transistor Q2 is ON and the transistor Q1 is OFF. The potential at the node S1 is maintained to 5 V if the transistor Q1 is OFF and the resistance is sufficiently high compared to the high resistance load R1. The potential at the node S2 is maintained to 0 V if the transistor Q2 is ON and the resistance is sufficiently low compared to the high resistance load R2.

However, under the above described condition, a D.C. current flows from the positive power source voltage Vcc supply line to the negative power source voltage Vss supply line via the node S2, and the current value is inversely proportional to the value of the high resistance load R2.

When the integration density of the above described high resistance load type SRAM increases, the number of memory cells per chip increases and the current consumption of the entire chip would become very large if the current consumption per memory is not reduced. Hence, the D.C. current described above must be reduced, but in order to reduce this D.C. current, the values of the high resistance loads R1 and R2 must be set large. However, when the values of the high resistance loads R1 and R2 are set large, it becomes difficult to stably maintain the potential at the nod having the driver transistor which is OFF, that is, the potential at the node S1 in FIG.3.

Because of the above described background, the TFT load type SRAM which uses the TFT as the load in place of the high resistance load has been developed.

Next, a description will be given of the TFT load type SRAM. Similarly to the description given above in respect of the high resistance load type SRAM, a description will first be given of the method of producing the TFT load type SRAM.

An example of a conventional method of producing the TFT load type SRAM will be described with reference to FIGS.4A through 4D and FIGS.5A through 5D. FIGS.4A through 4D are side views in cross section showing essential parts of the TFT load type SRAM at essential stages of the conventional method of producing the high resistance load type SRAM. FIGS.5A through 5D are plan views of the TFT load type SRAM at essential stages of the conventional method of producing the TFT load type SRAM.

FIGS.4A through 4D respectively are cross sections taken along a line which corresponds to a line Y—Y in the plan view of FIG.5D.

The processes of producing the TFT load type SRAM at the beginning are basically the same as the processes described in conjunction with FIGS.1A through 1G up to the process of forming the load resistor contact hole 9A of the high resistance load type SRAM, and a description thereof will be omitted. The only difference is that a contact hole 8A shown in FIG.5A is formed with respect to the ground line 8 which is made of the second polysilicon layer, so that a gate electrode of a TFT which is formed by a third polysilicon layer can make contact with an active region and the gate electrode 4 which is formed by the first polysilicon layer. Hence, a description will only be given from the processes thereafter. In FIGS.4A through 4D and 5A through 5D, those parts which are the same as those corresponding parts in FIGS.1A through 1J and 2A through 2F are designated by the same reference numerals.

In FIGS.4A and 5A, a CVD is carried out to form a third polysilicon layer having a thickness of 1500 Å, for example.

Then, an ion implantation is carried out to inject P ions with a dosage of $4 \times 10^{15}$ cm$^{-2}$ and an acceleration energy of 30 keV.

Further, a resist process of the photolithography technique and a RIE using $CCl_4/O_2$ as the etching gas are carried out to pattern the third polysilicon layer and form a gate electrode 15 of the TFT.

In FIG.4B, a CVD is carried out to form a gate insulator layer 16 of the TFT, which is made of $SiO_2$ and has a thickness of 300 Å, for example.

A resist process of the photolithography technique and a wet etching using hydrofluoric acid as the etchant are carried out to selectively etch the gate insulator layer 16 and form a drain contact hole 16A.

In FIGS.4C and 5B, a CVD is carried out to form a fourth polysilicon layer having a thickness of 500 Å, for example.

A resist process of the photolithography technique and an ion implantation with a dosage of $1 \times 10^{14}$ cm$^{-2}$ and an acceleration energy of 5 keV are carried out to inject B ions into a part where a supply line of a positive power source voltage Vcc is made and into a part where the TFT source and drain regions are formed.

A resist process of the photolithography technique and a RIE using $CCl_4/O_2$ as the etching gas are carried out to pattern the fourth polysilicon layer and form a source region 17, a drain region 18 and a channel region 19 of the TFT and also form a Vcc supply line 20.

In FIGS.4D and 5C, a CVD is carried out to form an insulator layer made of $SiO_2$ and having a thickness of 1000 Å, for example, and an insulator layer made of PSG and having a thickness of 5000 Å, for example. In FIG.4D, these two insulator layers are shown as one insulator layer 21, similarly as in the case of FIGS.1I and 1J.

Then, a thermal process is carried out to reflow and planarize the insulator layer 21.

Next, a resist process of the photolithography technique and a RIE using $CHF_3/He$ as the etching gas are carried out to selectively etch the insulator layer 21 and the like and to form a bit line contact hole.

A sputtering is carried out thereafter to form an Al layer having a thickness of 1 μm, for example, and this Al layer is patterned by the normal photolithography technique to form a bit line 22. Those elements which are shown in FIGS.4D and 5C but not yet described, such as "BL", will be readily understood from the description given later in conjunction with FIG.6.

FIG.5D shows the plan view of the essential part of the TFT load type SRAM which is completed by the above described processes. In FIG.5D, those parts which are the same as those corresponding parts in FIGS.4A through 4D and FIGS.5A through 5D are designated by the same reference numerals. However, for the sake of convenience, the illustration of the Al bit line 22 shown in FIGS.4D and 5C is omitted in FIG.5D.

FIG.6 shows an equivalent circuit diagram of an essential part of the TFT load type SRAM described in conjunction with FIGS.4A through 4D and 5A through 5D. In FIG.6, those parts which are the same as those corresponding parts in FIGS.4A through 4D and 5A through 5D are designated by the same reference numerals.

FIG.6 shows transistors Q5 and Q6 which are load TFTs used in place of the high resistance loads R1 and R2 shown in FIG.3.

Next, a description will be given of the operation of the TFT load type SRAM, and the storing operation in particular.

If it is assumed that the positive power source voltage Vcc is 5 V, the negative power source voltage Vss is 0 V, the node S1 is 5 V and the node S2 is 0 V, the transistor Q6 is OFF when the transistor Q2 is ON and the transistor Q5 is ON when the transistor Q1 is OFF. The potential at the node S1 is maintained to 5 V if the transistor Q1 is OFF and the resistance is sufficiently high compared to the transistor Q5 which is ON. The potential at the node S2 is maintained to 0 V if the transistor Q2 is ON and the resistance is sufficiently small compared to the transistor Q6 which is ON.

Under the above described condition, the resistance of the load transistor Q5 or Q6 changes depending on the stored information, and thus, the problems of the high resistance load type SRAM is eliminated. That is, it is possible to carry out a stable information storage operation. The channels of the transistors Q5 and Q6, that is, the channels of the load TFTs, are made of polysilicon. The crystal state of the polysilicon which forms the channels is considerably poor compared to the single crystal, and a current easily leaks even when the transistor is OFF. Such a leak current increases the current consumption of the chip, and it is desirable to make the channel as small as possible.

On the other hand, as may be readily seen from FIG.4D, the bit line 22 which is made of the Al layer is provided at the top layer of the TFT load type SRAM. In addition, the channel of the load TFT exists immediately under the bit line 22 via the insulator layer 21 which is made of PSG or the like.

But according to this construction, the bit line 22 which is made of the Al layer can be regarded as a gate electrode of a transistor, and the underlying insulator layer 21 can be regarded as a gate insulator layer of this transistor. In addition, the potential of the bit line 22 which is regarded as the gate electrode varies between 0 v (Vss) and 5 V (Vcc). As a result, the TFT which should be OFF, that is, the transistor Q6 becomes nearly ON, and the leak current increases and the parasitic effect becomes notable.

Accordingly, a double gate structure TFT load type SRAM was developed in order to eliminate the above described problems of the TFT load type SRAM.

According to the double gate structure TFT load type SRAM, the above described problems of the TFT load type SRAM are eliminated by interposing the third polysilicon layer of the TFT load type SRAM described in conjunction with FIGS.4 through 6 between the fourth polysilicon layer and the bit line 22 which is made of Al. Particularly, a fifth polysilicon layer forming a second gate electrode which has the same pattern as the gate electrode 15 of the TFT is interposed between the Al bit line 22 and the fourth polysilicon layer which forms the source region 17, the drain region 18, the channel region 19, the Vcc supply line 20 and the like.

FIGS.7A through 7C are side views in cross section showing essential parts of the double gate structure TFT load type SRAM at essential stages of the conventional method of producing the double gate structure TFT load type SRAM. The processes of producing the double gate structure TFT load type SRAM at the beginning are basically the same as the processes described in conjunction with FIGS.4A through 4C up to the process of forming the source region 17, the drain region 18, the channel region 19 and the Vcc supply line 20 of the TFT load type SRAM, and a description thereof will be omitted. Hence, a description will only be given from the processes thereafter. In FIGS.7A through 7C, those parts which are the same as those corresponding parts in FIGS.1 through 6 are designated by the same reference numerals.

In FIG.7A, a CVD is carried out to form an insulator layer 23 which is made of $SiO_2$ and has a thickness of 500 Å, for example.

A resist process of the photolithography technique and a RIE using $CHF_3+He$ as the etching gas are carried out to selectively etch the insulator layer 23 and to form a contact hole 23A with respect to the drain electrode 18 of the TFT.

In FIG.7B, a CVD is carried out to form a fifth polysilicon layer having a thickness of 1000 Å, for example.

Then, an ion implantation is carried out to inject P ions into the fifth polysilicon layer with a dosage of $4 \times 10^{15}$ cm$^{-2}$, for example.

A resist process of the photolithography technique and a RIE using $CCl_4/O_2$ as the etching gas are carried out to pattern the fifth polysilicon layer and to form a second gate electrode 24 of the TFT.

In FIG.7C, a CVD is carried out to form an insulator layer which is made of $SiO_2$ and has a thickness of 1000 Å, for example, and an insulator layer which is made of PSG and has a thickness of 5000 Å, for example. As in the case shown in FIG.4D, these two insulator layers are shown as one insulator layer 25 in FIG.7C.

Thereafter, a thermal process is carried out to reflow and planarize the insulator layer 25.

Next, a resist process of the photolithography technique and a RIE using $CHF_3/He$ as the etching gas are carried out to selectively etch the insulator layer 25 and the like, and to form a bit line contact hole.

In addition, a sputtering is carried out to form an Al layer having a thickness of 1 μm, for example, and this Al layer is patterned by the normal photolithography technique so as to form a bit line 26.

As described heretofore, the SRAM started from the high resistance load type, evolved to the TFT load type, and further evolved to the double gate structure TFT load type. However, as may be seen by comparing FIGS.1A through 1J with FIGS.7A through 7C, and FIGS. 1J and 7C in particular, the number of polysilicon layers has increased by two from the high resistance load type SRAM to the double gate structure TFT load type SRAM, and the number of mask processes have increased by four.

SUMMARY OF THE INVENTION

Accordingly, it is a general object of the present invention to provide a novel and useful thin film transistor (TFT) load type static random access memory (SRAM) in which the problems described above are eliminated.

Another and more specific object of the present invention is to provide a semiconductor memory device comprising a semiconductor substrate, a memory cell provided on the semiconductor substrate and including first and second transfer transistors, first and second driver transistors and first and second thin film transistor loads, where each of the first and second transfer transistors, the first and second driver transistors and the first and second thin film transistor loads have a source, a drain and a gate electrode, and a connecting region in which the drain of the second thin film transistor load, the gate electrode of the first thin film transistor load and the gate electrode of the first driver transistor are connected, where the gate electrode of the first driver transistor, the gate electrode of the first thin film transistor load and the drain of the second thin film transistor load are made of conductor layers which are stacked on the semiconductor substrate with an insulator layer interposed between the conductor layers, and a top one of the stacked conductor layers makes contact with a top surface of a bottom one of the stacked conductor layers and with side surfaces of each conductor layer provided between the top and bottom conductor layers within the connecting region. According to the semiconductor memory device of the present invention, the connection of the driver transistor and the thin film transistor load in the connecting region can be achieved by forming a contact hole in one process. Hence, the number of mask processes can be reduced by one compared to the conventional method of producing the TFT load type SRAM, and by two compared to the conventional method of producing the double gate structure TFT load type SRAM. Therefore, the TFT load type SRAM can be produced with ease using simple processes and with a high production yield.

Still another object of the present invention is to provide a method of producing a semiconductor memory device which includes a memory cell made up of two transfer transistors, two driver transistors and two thin film transistor loads, which method comprises the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming a second insulator layer after forming and patterning a second conductor layer, (e) forming a contact hole which extends from a top surface of the second insulator layer and reaches a top surface of the first conductor layer, and (f) forming a third conductor layer which makes contact with the top surface of the first conductor layer and with side surfaces of the second conductor layer. According to the method of the present invention, the connection of the driver transistor and the thin film transistor load can be achieved by forming the contact hole in one process. Hence, the number of mask processes can be reduced by one compared to the conventional method of producing the TFT load type SRAM. Therefore, the TFT load type SRAM can be produced with ease using simple processes and with a high production yield.

A further object of the present invention is to provide a method of producing a semiconductor memory device which includes a memory cell made up of two transfer transistors, two driver transistors and two thin film transistor loads, which method comprises the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming a second insulator layer after forming and patterning a second conductor layer, (e) forming a third insulator layer after forming and patterning a third conductor layer, (f) forming a contact hole which extends from a top surface of the third insulator layer and reaches a top surface of the first conductor layer, and (g) forming a fourth conductor layer which makes contact with the top surface of the first conductor layer and with side surfaces of the second and third conductors layer. According to the method of the present invention, the connection of the driver transistor and the thin film transistor load can be achieved by forming the contact hole in one process. Hence, the number of mask processes can be reduced by two compared to the conventional method of producing the double gate structure TFT load type SRAM. Therefore, the TFT load type SRAM can be produced with ease using simple processes and with a high production yield.

Another object of the present invention is to provide a method of producing the semiconductor memory device of either one of the types described above, wherein wherein the step (b) includes the substeps of forming a first layer which is made of a conductive material, and forming a second layer which is made of a material on the first layer to form the first conductor layer which is made up of the first and second layers, where the second layer is made of a material selected from a group consisting of refractory metals and refractory metal silicides. According to the method of the present invention, it is possible to prevent damage to the first conductor layer and the semiconductor substrate including the impurity regions thereof. Further, it is possible to prevent and etching residue from remaining within the contact hole when the contact hole is formed.

Other objects and further features of the present invention will be apparent from the following detailed description when read in conjunction with the accompanying drawings.

BRIEF DESCRIPTION OF THE DRAWINGS

FIGS. 1A through 1J are side views in cross section showing essential parts of a high resistance load type SRAM at essential stages of a conventional method of producing the high resistance load type SRAM;

FIGS.12A through 12H are side views in cross section showing an essential part of the third embodiment of the semiconductor memory device according to the present invention at essential stages of the third embodiment of the method of producing the semiconductor memory device according to the present invention; and FIGS.13A through 13D are side views in cross section showing an essential part of a fourth embodiment of the semiconductor memory device according to the present invention at essential stages of a fourth embodiment of the method of producing the semiconductor memory device according to the present invention.

DESCRIPTION OF THE PREFERRED EMBODIMENTS

Figure 1A:
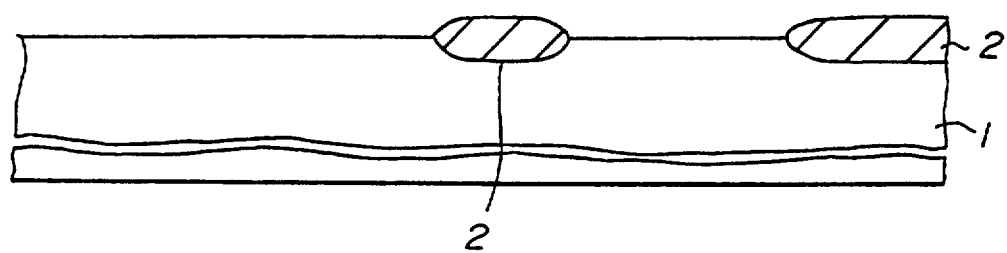
Figure 1B:
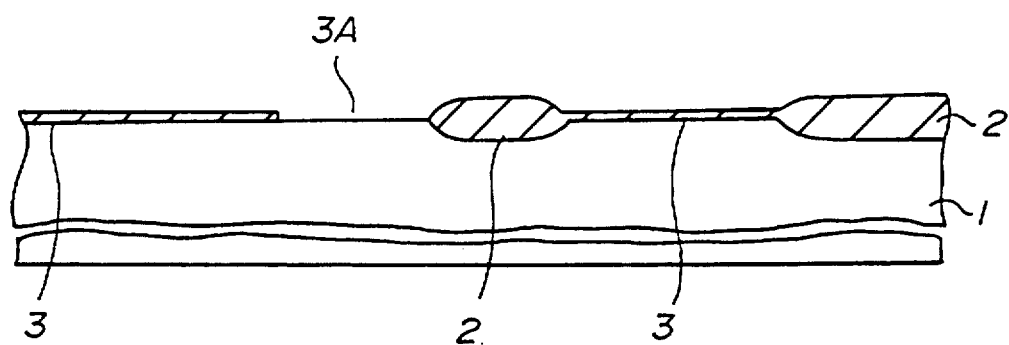
Figure 1C:
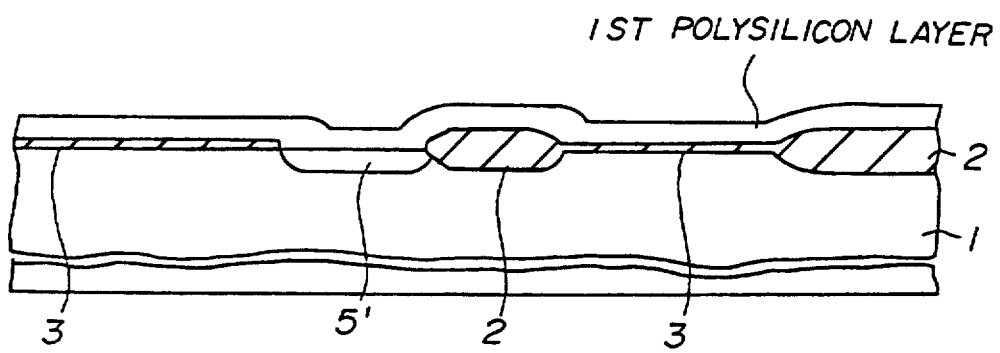
Figure 1D:
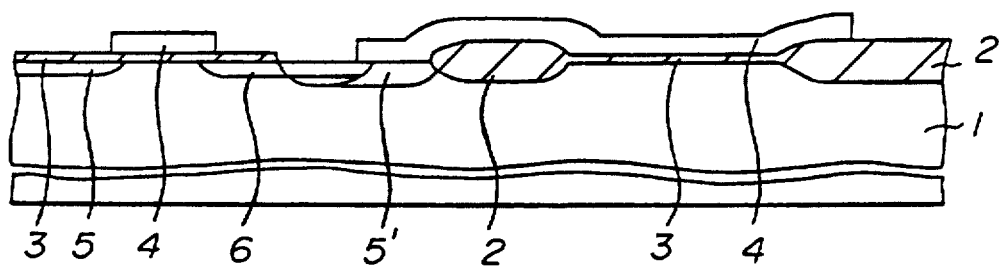
Figure 1G:
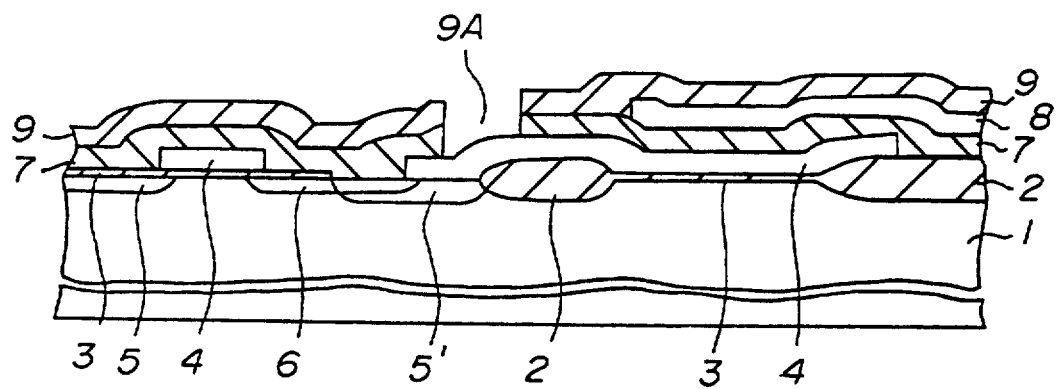
Figure 1H:
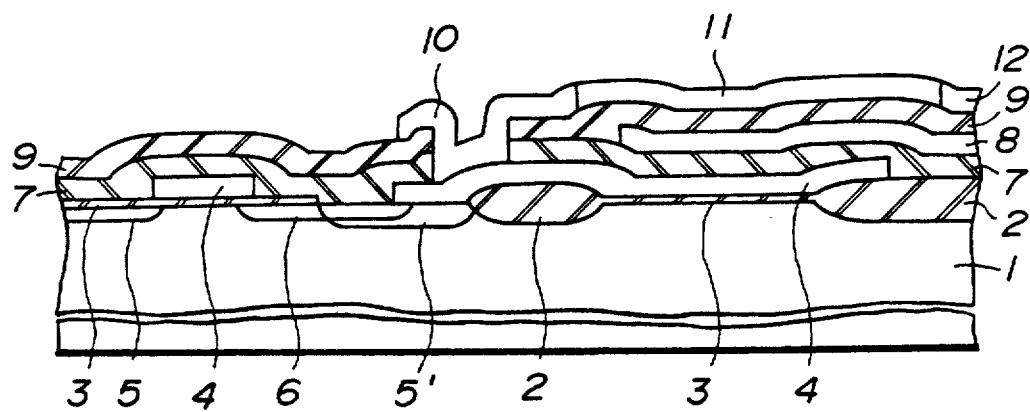
Figure 11:
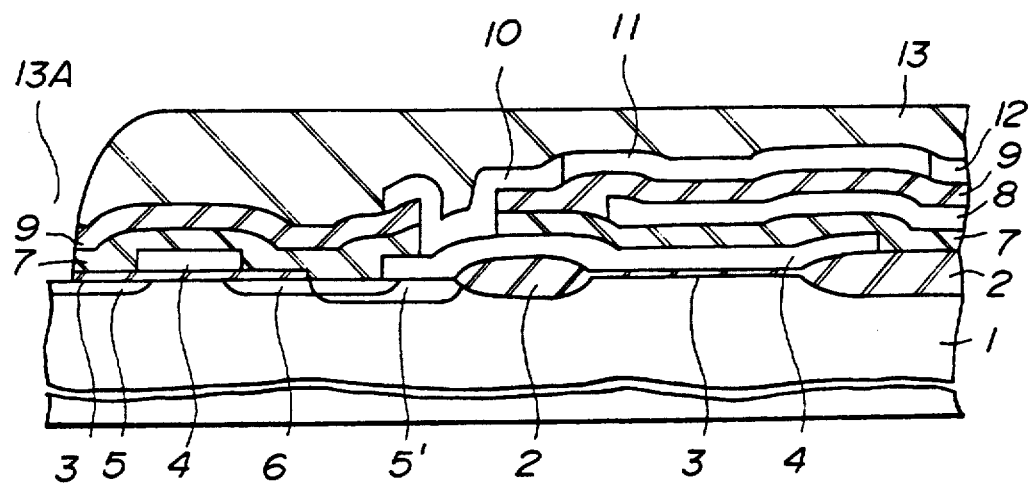
FIGS.11A through 11F are side views in cross section showing an essential part of a third embodiment of the semiconductor memory device according to the present invention at essential stages of a third embodiment of the method of producing the semiconductor memory device according to the present invention, for explaining the operating principle of the third embodiment.
Figure 1J:
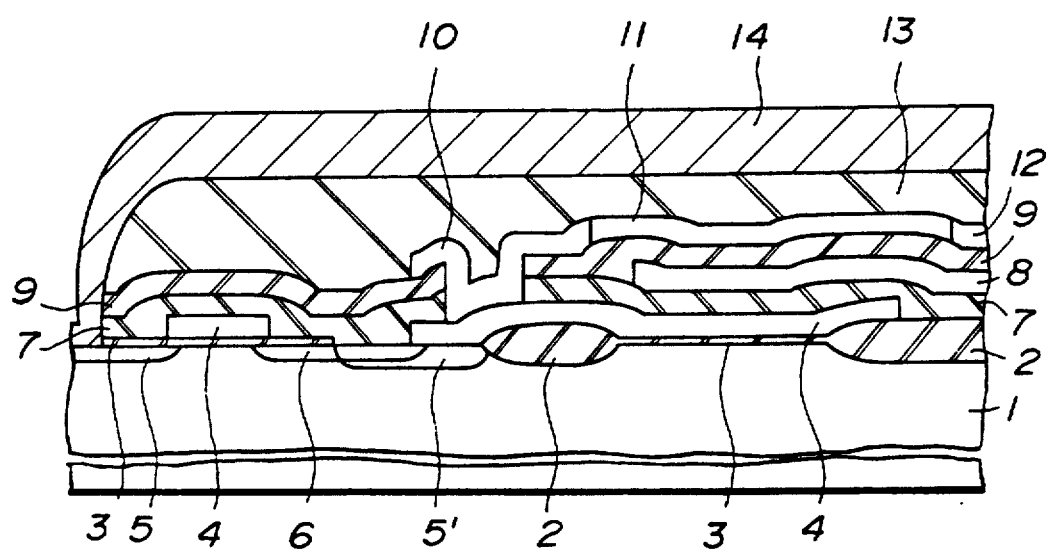

FIGS.8A through 8D are side views in cross section showing an essential part of a first embodiment of a semiconductor memory device according to the present invention at essential stages of a first embodiment of a method of producing the semiconductor memory device according to the present invention. In this embodiment, the present invention is applied to the TFT load type SRAM.

In this embodiment of the method, the processes are the same as those of the prior art method up to the processes shown in FIGS.1A through 1F, that is, until a ground line 8 is formed from the second polysilicon layer. Hence, a description will only be given of the processes carried out thereafter. In the following description, the prior art processes descried with reference to FIGS.4A through 4D will help the understanding of this embodiment.

In FIGS.8A through 8D, those parts which are the same as those corresponding parts in FIGS.1A through 1J are designated by the same reference numerals, and a description thereof will be omitted.

Figure 8A:
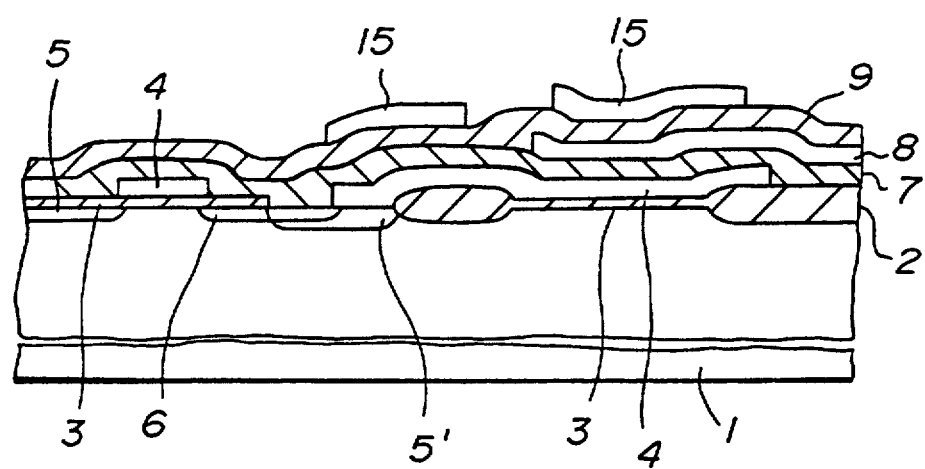
FIGS.8A through 8D are side views in cross section showing an essential part of a first embodiment of a semiconductor memory device according to the present invention at essential stages of a first embodiment of a method of producing the semiconductor memory device according to the present invention.

In FIG.8A, a TFT load type SRAM includes a Si semiconductor substrate 1, a field insulator layer 2 formed on the Si semiconductor substrate 1, a gate insulator layer 3, a gate electrode 4 of the driver transistor which is made up of the first polysilicon layer, an n+-type impurity region 5', an n+-type source region 5, an n+-type drain region 6, an insulator layer 7, and a ground line 8 which is made up of the second polysilicon layer.

A CVD is carried out to form an insulator layer 9 which is made of $SiO_2$ and has a thickness of 1000 Å, for example, on the entire top surface of the stacked structure.

A CVD is carried out to form a third polysilicon layer having a thickness of 500 Å, for example.

Then, an ion implantation is carried out to inject P ions into the third polysilicon layer with a dosage of $1 \times 10^{15}$ cm$^{-2}$ and an acceleration energy of 10 keV.

In addition, a resist process of the photolithography technique and a RIE using $CCl_4/O_2$ as the etching gas are carried out to pattern the third polysilicon layer and to form a gate electrode 15 of the TFT.

Figure 8B:
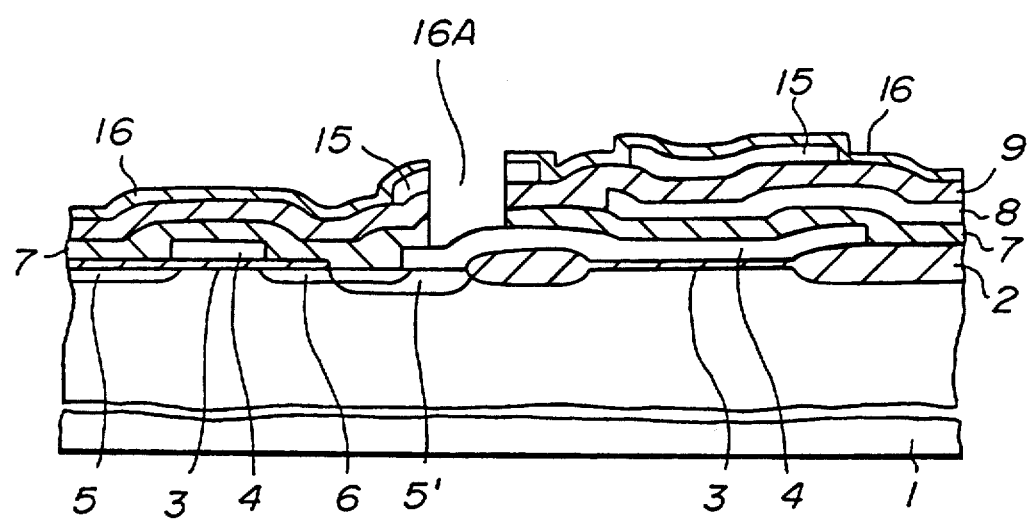

In FIG.8B, a CVD is carried out to form a gate insulator layer 16 of the TFT, which is made of $SiO_2$ and has a thickness of 200 Å, for example.

A resist process of the photolithography technique and RIEs using $CHF_3/He$ and $CCl_4/O_2$ as etching gases for respectively etching $SiO_2$ and polysilicon are carried out, to selectively etch the gate insulator layer 16, the gate electrode 15 which is formed from the third polysilicon layer, the insulator layer 9 and the insulator layer 7, and to form a contact hole 16A. This contact hole 16A extends from the surface of the gate insulator layer 16 and reaches the gate electrode 4 of the driving transistor made of the first polysilicon layer. This process forms an essential part of this embodiment.

Figure 8C:
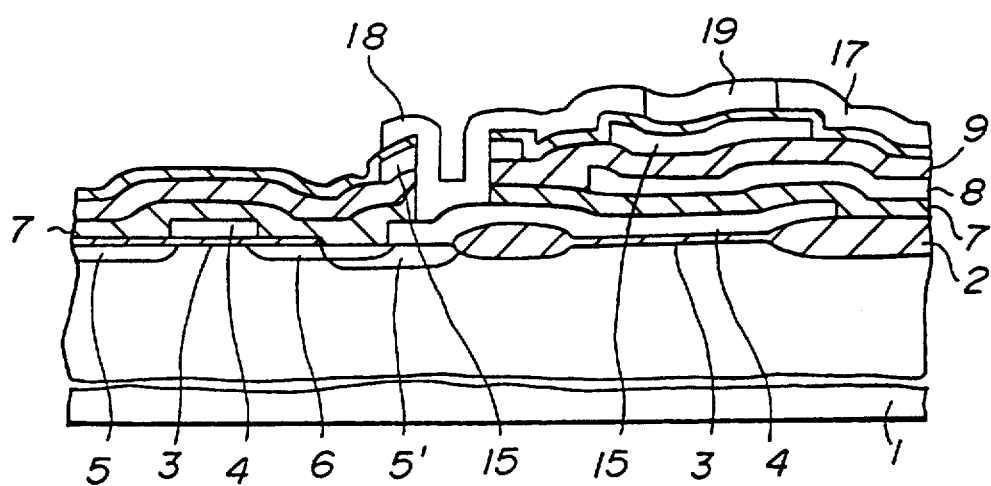

In FIG.8C, a CVD is carried out to form a fourth polysilicon layer having a thickness of 200 Å, for example.

A resist process of the photolithography technique and an ion implantation are carried out to inject B ions with a dosage of $1 \times 10^{14}$ cm$^{-2}$ and an acceleration energy of 5 keV into parts where source and drain regions of the TFT are formed.

Then, a resist process of the photolithography technique and a RIE using $CCl_4/O_2$ as the etching gas are carried out to pattern the fourth polysilicon and to form a source region 17, a drain region 18 and a channel region 19 of the TFT and a Vcc supply line. The Vcc supply line cannot be seen in FIG.8C.

Figure 8D:
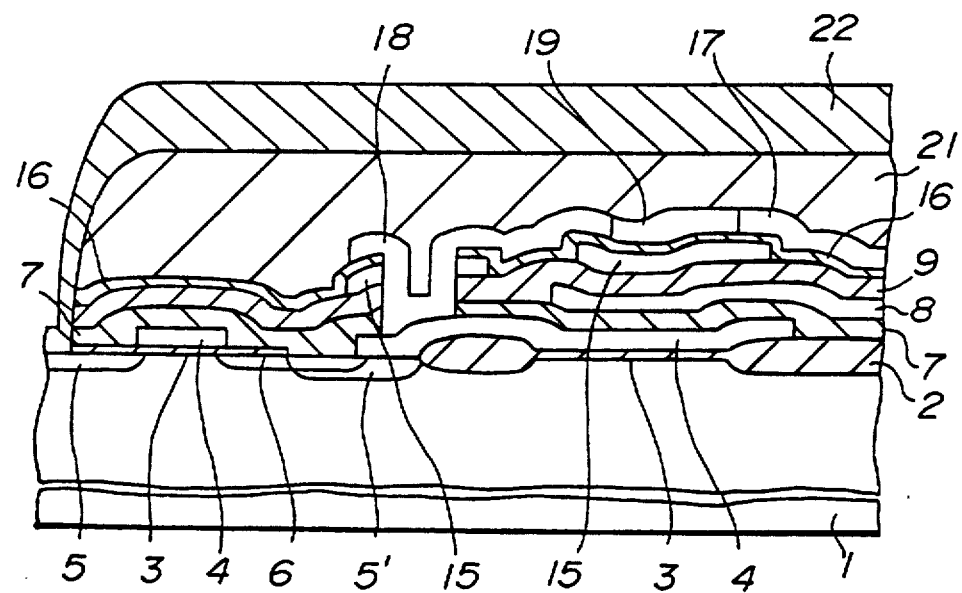

In FIG.8D, a CVD is carried out to form an insulator layer which is made of SiO$_2$ and has a thickness of 1000 Å, for example, and an insulator layer which is made of PSG and has a thickness of 5000 Å, for example. In FIG.8D, these two insulator layers are shown as one insulator layer 21.

Thereafter, a thermal process is carried out to reflow and planarize the insulator layer 21.

A resist process of the photolithography technique and a RIE using CHF$_3$/He as the etching gas are carried out to selectively etch the insulator layer 21 and the like and to form a bit line contact hole.

An Al layer having a thickness of 1 μm, for example, is formed by a sputtering process, and this Al layer is patterned using the normal photolithography technique to form a bit line 22.

As is evident from the description given above with reference to FIGS.8A through 8C, the contact of the gate electrode of the driver transistor, the gate electrode of the TFT load and the drain of the TFT load is achieved by a single mask process. On the other hand, in the case of the prior art method described with reference to FIGS.4 and 5, two mask processes are required to achieve this contact.

Next, a description will be given of a second embodiment of the semiconductor memory device according to the present invention which is produced by a second embodiment of the method of producing the semiconductor memory device according to the present invention, by referring to FIGS.9A through 9D.

FIGS.9A through 9D are side views in cross section showing an essential part of the second embodiment of the semiconductor memory device according to the present invention at essential stages of the second embodiment of the method of producing the semiconductor memory device according to the present invention. In this embodiment, the present invention is applied to the double gate structure TFT load type SRAM.

In this embodiment of the method, the processes are the same as those of the first embodiment of the method up to the processes shown in FIG.8A, that is, until a gate electrode 15 of the TFT load is formed from the third polysilicon layer. Hence, a description will only be given of the processes carried out thereafter. In the following description, the prior art processes described with reference to FIGS.7A through 7C will help the understanding of this embodiment.

In FIGS.9A through 9D, those parts which are the same as those corresponding parts in FIGS.7A through 7C and FIGS.8A through 8D are designated by the same reference numerals, and a description thereof will be omitted.

Figure 9A:
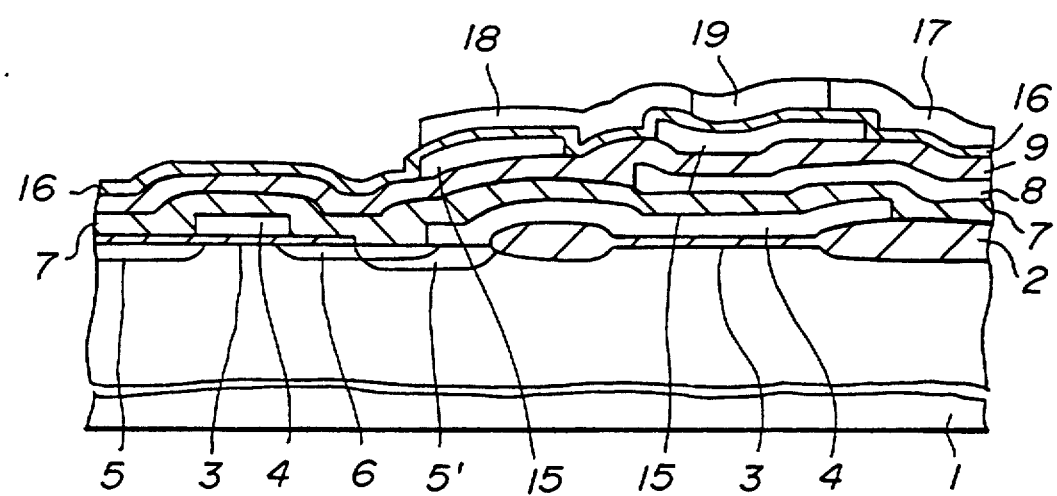
FIGS.9A through 9D are side views in cross section showing an essential part of a second embodiment of the semiconductor memory device according to the present invention at essential stages of a second embodiment of the method of producing the semiconductor memory device according to the present invention.

In FIG.9A, a double gate structure TFT load type SRAM includes a Si semiconductor substrate 1, a field insulator layer 2 formed on the Si semiconductor substrate 1, a gate insulator layer 3, a gate electrode 4 of the driver transistor which is made up of the first polysilicon layer, an n+-type impurity region 5', an n+-type source region 5, an n+-type drain region 6, an insulator layer 7, a ground line 8 which is made up of the second polysilicon layer, a lower gate electrode 15 of the TFT, and a gate insulator layer 16 of the TFT.

A CVD is carried out to form a fourth polysilicon layer having a thickness of 200 Å, for example.

A resist process of the photolithography technique and an ion implantation are carried out to inject B ions with a dosage of $1 \times 10^{14}$ cm$^{-2}$ and an acceleration energy of 5 keV into parts where source and drain regions of the TFT are formed.

A resist process of the photolithography technique and a RIE using CCl$_4$/O$_2$ as the etching gas are carried out to pattern the fourth polysilicon layer and to form a source region 17, a drain region 18 and a channel region 19 of the TFT and a Vcc supply line. The Vcc supply line cannot be seen in FIG.9A.

Figure 9B:
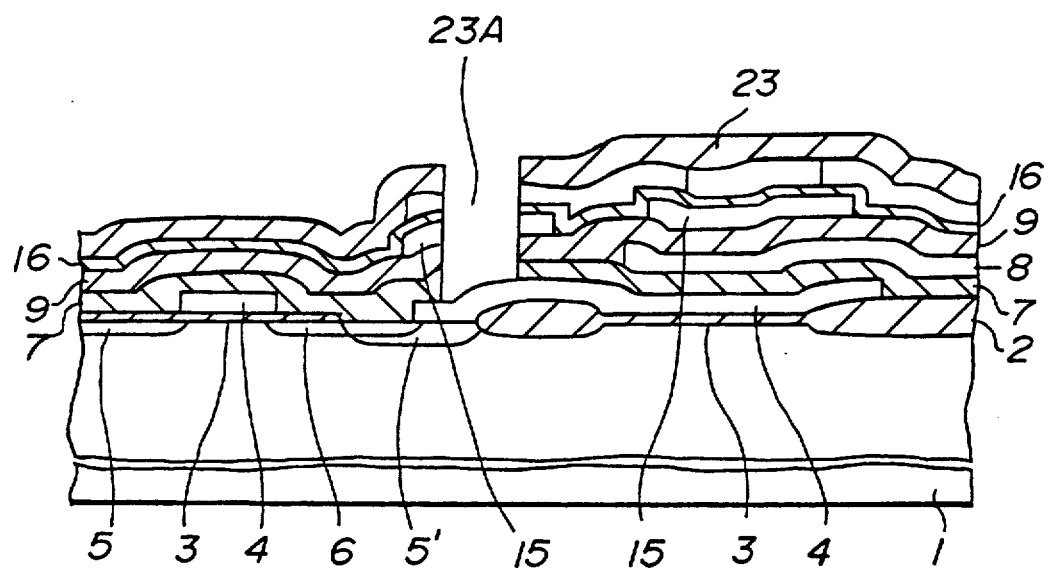

In FIG.9B, a CVD is carried out to form an insulator layer 23 which is made of SiO$_2$ and has a thickness of 500 Å, for example.

A resist process of the photolithography technique and RIEs using CHF$_3$/He and CCl$_4$/O$_2$ as the etching gases are respectively carried out to etch the SiO$_2$ and the polysilicon, to selectively etch the insulator layer 23, the drain region 18 of the TFT load formed by the fourth polysilicon, the gate insulator layer 16, the gate electrode 15 formed by the third polysilicon layer, the insulator layer 9 and the insulator layer 7, and to form a contact hole 23A. This contact hole 23A extends from the surface of the insulator layer 23 and reaches the surface of the gate electrode 4 of the driving transistor made of the first polysilicon. This process forms an essential part of this embodiment.

Figure 9C:
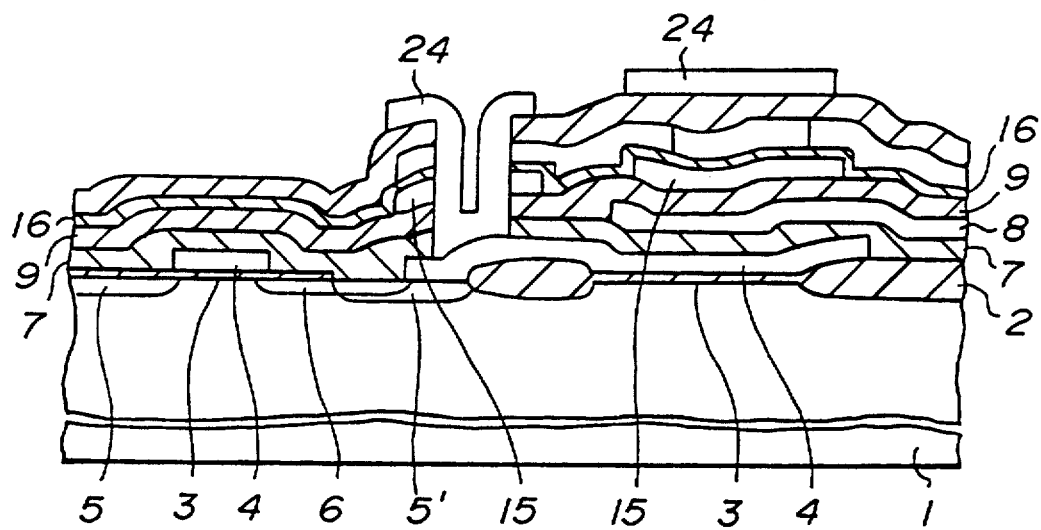

In FIG.9C, a CVD is carried out to form a fifth polysilicon layer having a thickness of 500 Å, for example.

Then, a thermal diffusion is carried out to diffuse P into the fifth polysilicon with an impurity concentration of $1 \times 10^{21}$ cm$^{-3}$, for example.

A resist process of the photolithography technique and a RIE using CCl$_4$/O$_2$ as the etching gas are carried out to pattern the fifth polysilicon layer and to form an upper gate electrode 24 of the TFT.

Figure 9D:
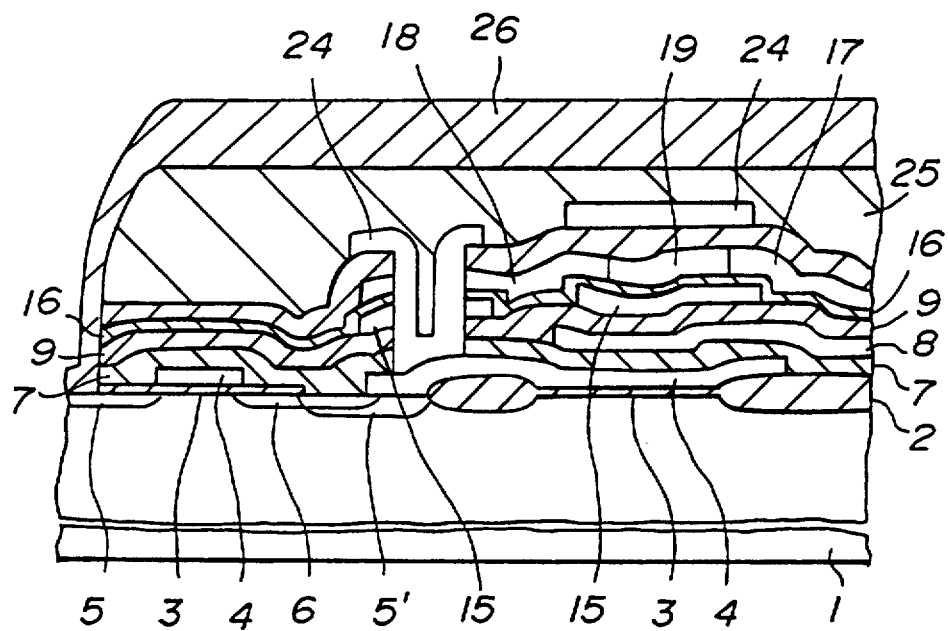

In FIG.9D, a CVD is carried out to form an insulator layer which is made of SiO$_2$ and has a thickness of 1000 Å, for example, and an insulator layer which is made of PSG and has a thickness of 5000 Å, for example. In FIG.9D, these two insulator layers are shown as one insulator layer 25.

Then, a thermal process is carried out to reflow and planarize the insulator layer 25.

A resist process of the photolithography technique and a RIE using CHF$_3$/He as the etching gas are carried out to selectively etch the insulator layer 25 and the like and to form a bit line contact hole.

Next, an Al layer having a thickness of 1·μm, for example, is formed by a sputtering process, and this Al layer is patterned using the normal photolithography technique to form a bit line 26.

Figure 7A:
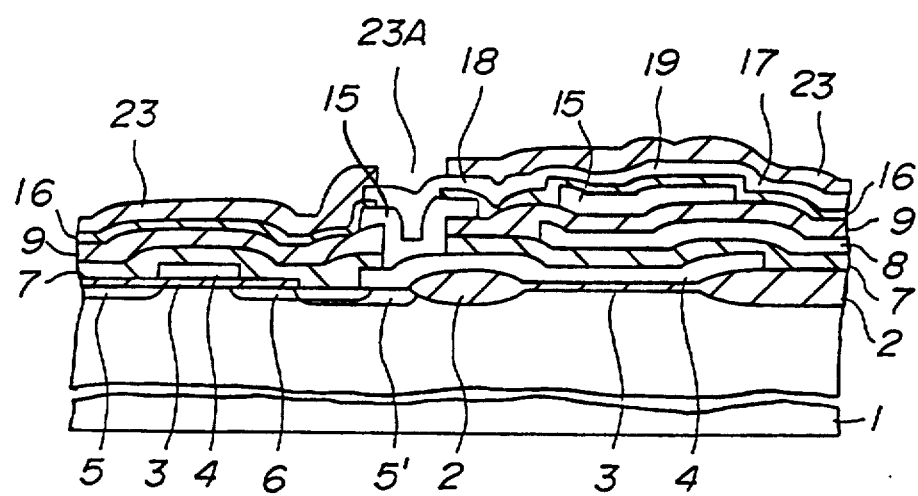
FIGS.7A through 7C are side views in cross section showing essential parts of a double gate structure TFT load type SRAM at essential stages of a conventional method of producing the double gate structure TFT load type SRAM.
Figure 7B:
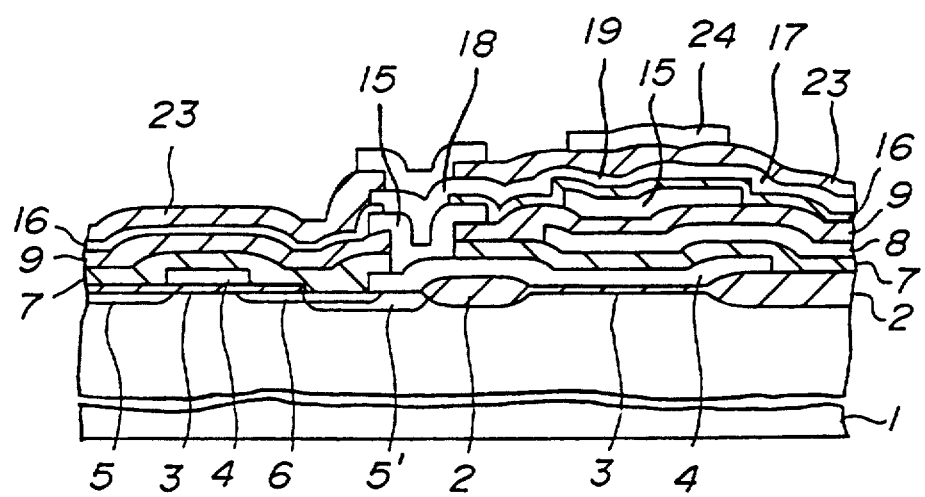
Figure 7C:
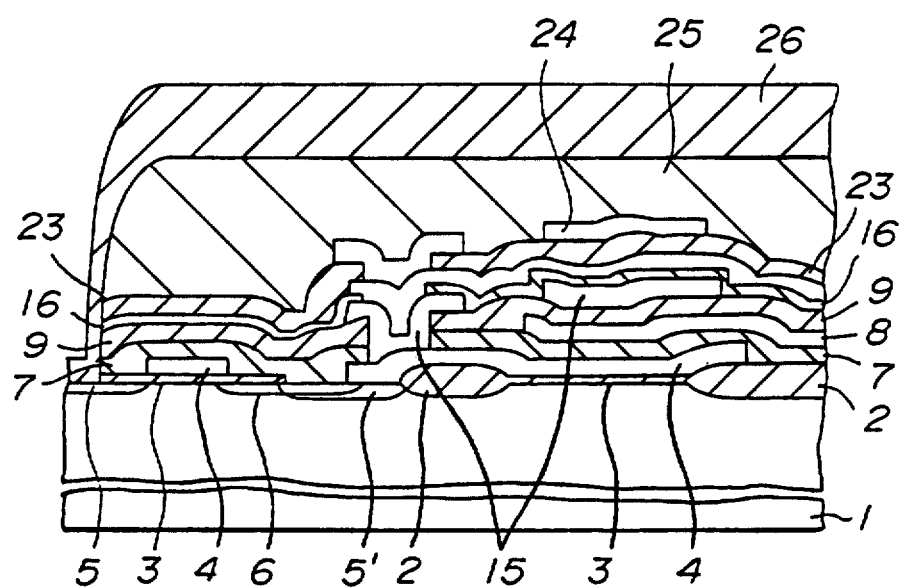

According to this embodiment described above with reference to FIGS.9A through 9D, the concept of the present invention is applied to the double gate structure TFT load type SRAM, and it can be seen that the number of mask processes is reduced by two compared to the prior art described with reference to FIGS.7A through 7C.

In the first and second embodiments described above, the insulator layers made of SiO$_2$ and the polysilicon layers are etched during the process of forming the contact hole 16A shown in FIG.8B and the contact hole 23A shown in FIG.9B. However, the following problems may occur when penetrating the stacked structure which is made up of the insulator layers and polysilicon layers.

FIGS.10A through 10F are side views in cross section showing essential parts of a semiconductor memory device at essential stages of the production, for explaining the process of forming a contact hole which penetrates a stacked structure. In each of FIGS.10A through 10F, the left hand side shows the result of an expected process while the right hand side shows the result of an actual process, and the description will be given mainly with reference to the right hand side of FIGS.10A through 10F which shows the actual process.

Figure 10A:
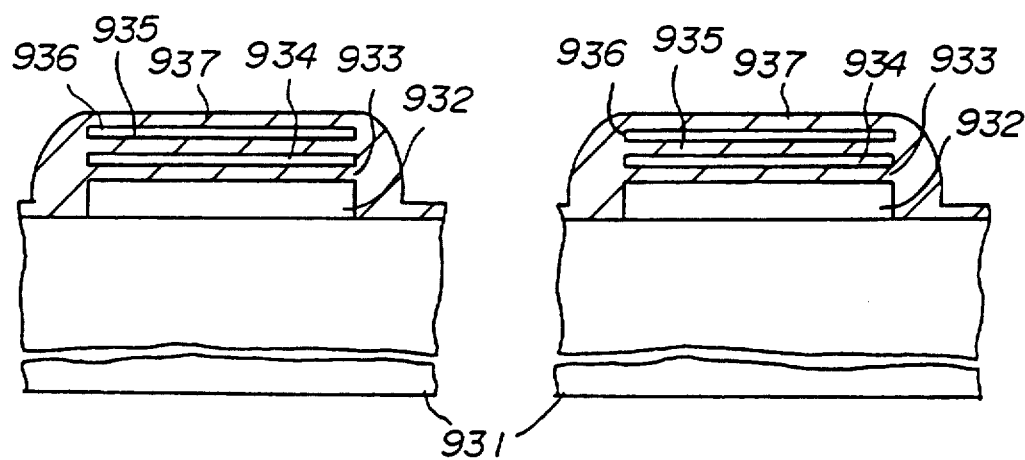
FIG.10A through 10F are side views in cross section showing essential parts of a semiconductor memory device at essential stages of the production, for explaining the process of forming a contact hole which penetrates a stacked structure.

In FIG.10A, a first conductor layer 932 made of polysilicon, a first insulator layer 933 made of $SiO_2$, a second conductor layer 934 made of polysilicon, a second insulator layer 935 made of $SiO_2$, a third conductor layer 936 made of polysilicon and a third insulator layer 937 made of $SiO_2$ are successively formed and stacked on a Si semiconductor substrate 931.

Figure 10B:
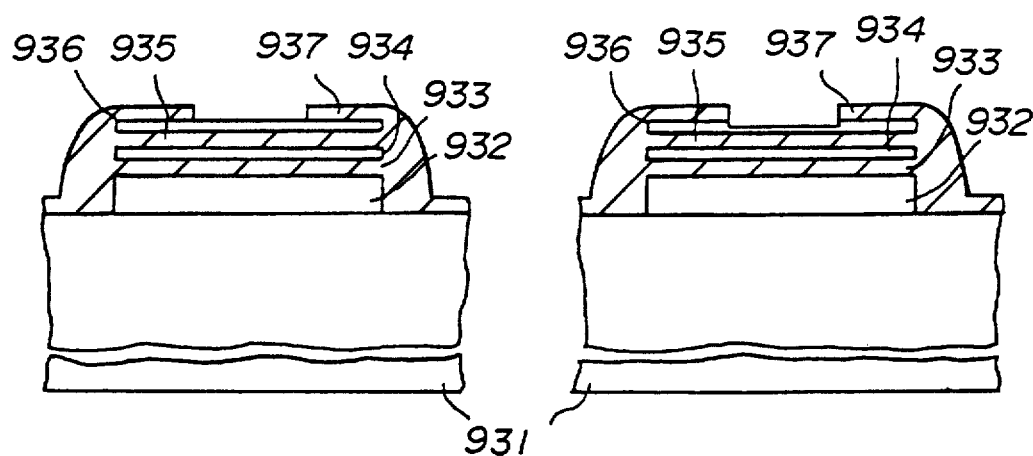

In FIG.10B, a resist process of the normal photolithography technique and a RIE using $CHF_3/He$ as the etching gas are carried out to etch the third insulator layer 937 and to form a part of a contact hole. In FIG.10B, the illustration of a photoresist layer is omitted for the sake of convenience. The illustration of the photoresist layer will be omitted similarly in FIGS.10C through 10F which follow.

When etching the third insulator layer 937, a part of the underlying third conductor layer 936 is also etched. As a result, the remaining third conductor layer 936 becomes extremely thin when the third conductor layer 936 is thin to start with.

Figure 10C:
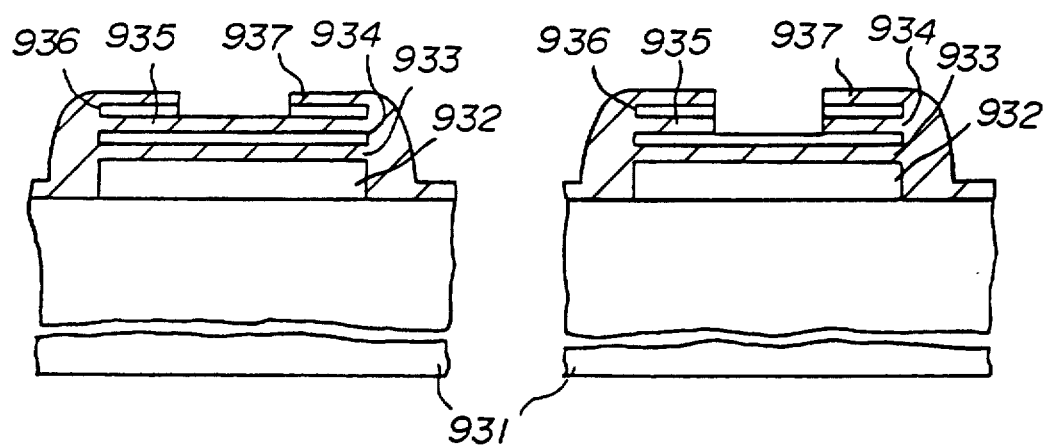

In FIG.10C, a RIE using $CCl_4/O_2$ as the etching gas is carried out to etch the third conductor layer 936.

Although dependent on the thickness of the underlying second insulator layer 935, the thickness of the second insulator layer 935 becomes extremely thin when the third conductor layer 936 is etched. In an extreme case, not only the second insulator layer 935 but also a part of the second conductor layer 934 may be etched when etching the third conductor layer 936.

Figure 10D:
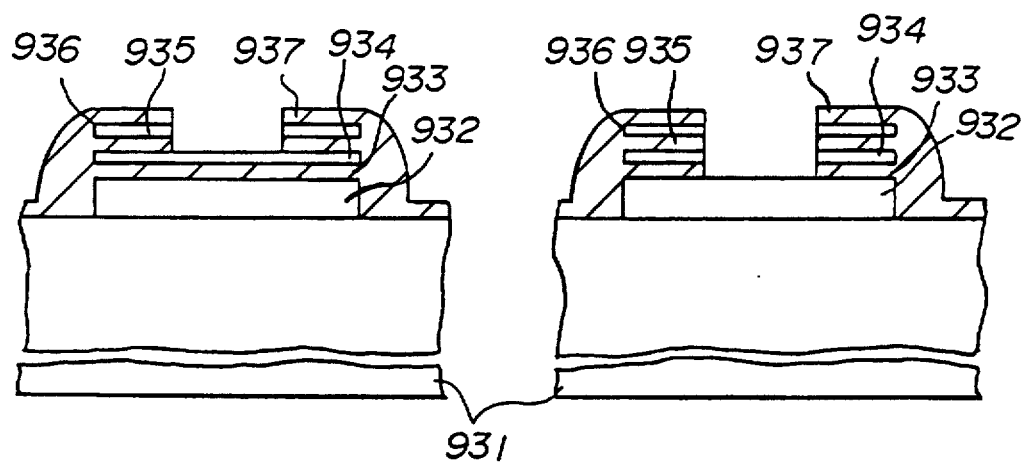

In FIG.10D, a RIE using $CHF_3/He$ as the etching gas is carried out to etch the second insulator layer 935. However, although this etching is originally intended to etch the second insulator layer 935, the second insulator layer 935 may not exist from the start of this etching, for the reasons described above.

If the second insulator layer 935 is extremely thin or does not even exist at the start of this etching, the second conductor layer 934 and the first insulator layer 933 are etched although this etching is originally intended to etch the second insulator layer 935. When the second conductor layer 934 and the first insulator layer 933 are etched, the surface of the first conductor layer 932 may become exposed by this etching which is originally intended to etch the second insulator layer 935.

Figure 10E:
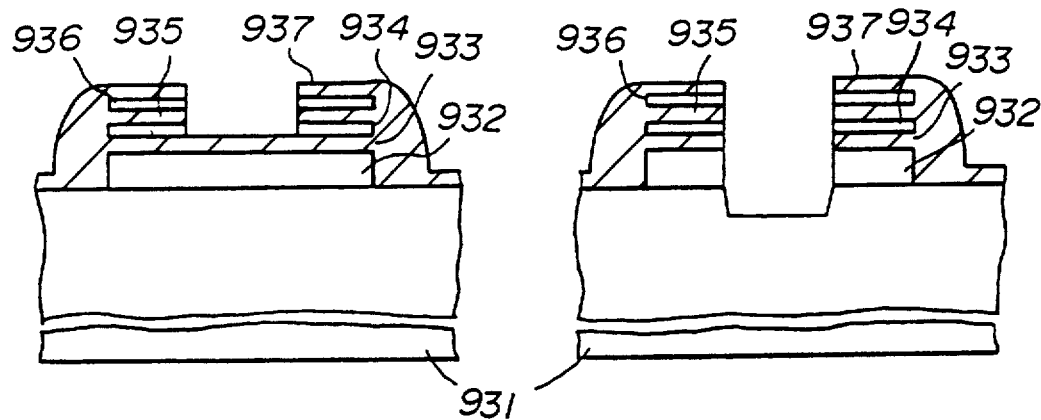

In FIG.10E, a RIE using $CCl_4/O_2$ as the etching gas is carried out to etch the second conductor layer 934.

However, although this etching is originally intended to etch the second conductor layer 934, the surface of the first conductor layer 932 may already be exposed as described above. In this case, even a part of the Si semiconductor substrate 931 may be etched by this etching which is originally intended to etch the second conductor layer 934.

Figure 10F:
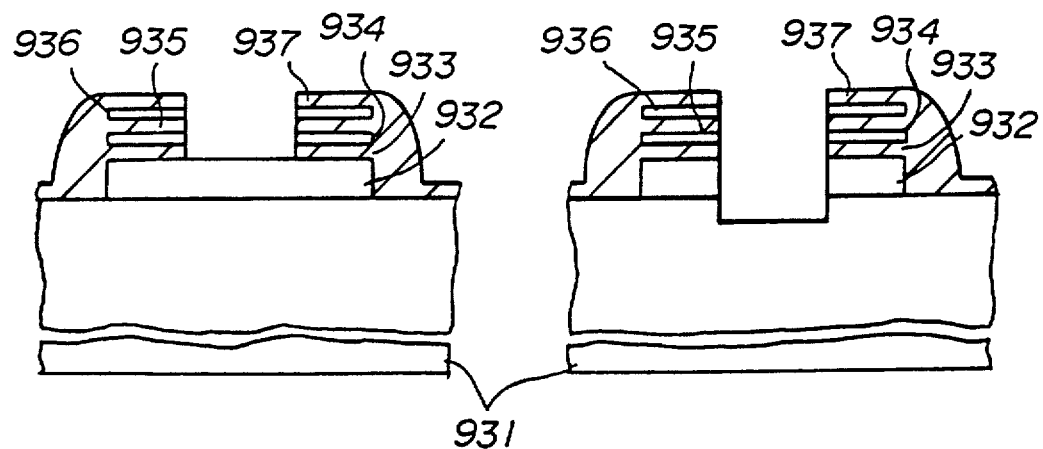

In FIG.10F, a RIE using $CHF_3/He$ as the etching gas is carried out to etch the first insulator layer 933.

But although this etching is originally intended to etch the first insulator layer 933, a part of the Si semiconductor substrate 931 may already be etched as described above. In this case, the contact hole completely extends into the Si semiconductor substrate 931 as shown in FIG.10F and the Si semiconductor substrate 931 is extremely damaged.

If the contact hole extends into the Si semiconductor substrate 931 as shown in FIG.10F, a leak is introduced at a node part between the driver transistor and the load transistor of the memory cell, and the operation of the memory cell becomes unstable. Hence, it is conceivable to carry out a moderate etching so as to etch only the originally intended layer, but such a moderate etching is difficult to control.

The etching of each layer cannot be controlled to etch only the originally intended layer by the moderate etching, because the contact hole is seldom formed at a flat part shown in FIGS.10A through 10F. In actual practice, the contact hole is usually formed at a stepped part, and an etching residue tends to remain at the stepped part within the contact hole. However, a sufficient over-etching becomes necessary in order to remove such an etching residue.

Next, a description will be given of a third embodiment of the semiconductor memory device according to the present invention which is produced by a third embodiment of the method of producing the semiconductor memory device according to the present invention. FIGS.11A through 11F are side views in cross section showing an essential part of the third embodiment of the semiconductor memory device according to the present invention at essential stages of the third embodiment of the method of producing the semiconductor memory device according to the present invention, for explaining the operating principle of the third embodiment. In each of FIGS.11A through 11F, the left hand side shows the result of an expected process while the right hand side shows the result of an actual process, and the description will be given mainly with reference to the right hand side of FIGS.11A through 11F which shows the actual process.

In this embodiment, measures are taken so that the contact hole will not extend into the substrate even when an over-etching is carried out to remove the etching residue within the contact hole.

Figure 11A:
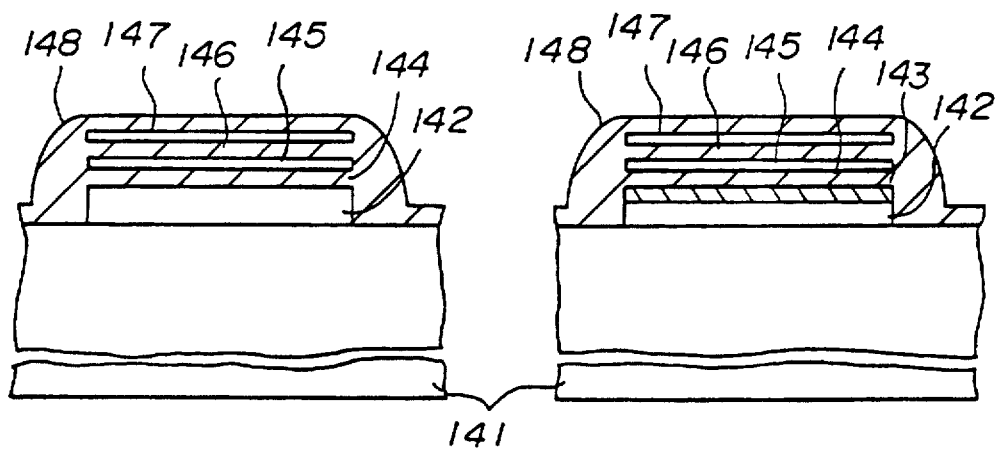

In FIG.11A, a first conductor layer 142 made of polysilicon, a second conductor layer 143 made of a refractory metal such as W and Mo or a silicide thereof, a first insulator layer 144 made of $SiO_2$, a third conductor layer 145 made of polysilicon, a second insulator layer 146 made of $SiO_2$, a fourth conductor layer 147 made of polysilicon and a third insulator layer 148 made of $SiO_2$ are successively formed and stacked on a Si semiconductor substrate 141.

Figure 11B:
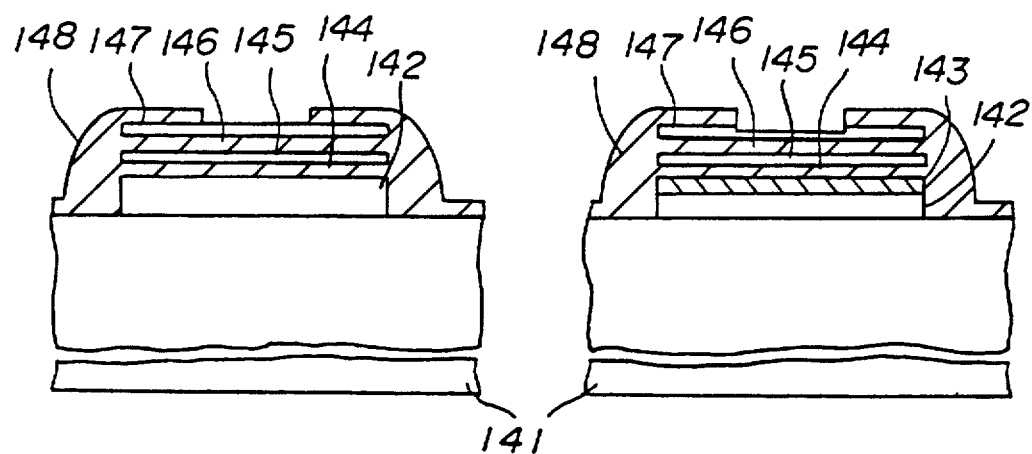

In FIG.11B, a resist process of the normal photolithography technique and a RIE using $CHF_3/He$ as the etching gas are carried out to etch the third insulator layer 148 and to form a part of a contact hole. In FIG.11B, the illustration of a photoresist layer is omitted for the sake of convenience. The illustration of the photoresist layer will be omitted similarly in FIGS.11C through 11F which follow.

During this process, a part of the fourth conductor layer 147 underlying the third insulator layer 148 is also etched. Accordingly, the thickness of the fourth conductor layer 147 remaining after this etching is also extremely small, similarly as in the case described above with reference to FIGS.10A through 10F.

Figure 11C:
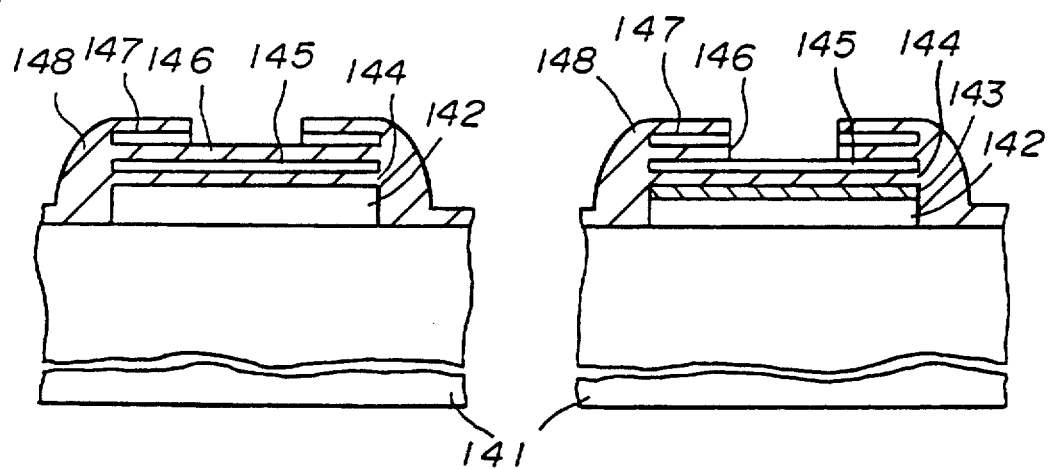

In FIG.11C, a RIE using $HBr/Ar$ as the etching gas is carried out to etch the fourth conductor layer 147.

In this case, although dependent on the thickness of the second insulator layer 146 underlying the fourth conductor layer 147, the thickness of the second insulator layer 146 would be reduced by this etching. In an extreme case, not only the second insulator layer 146 but also a part of the third conductor layer 145 becomes etched by this etching which is originally intended to etch the fourth conductor layer 147.

Figure 11D:
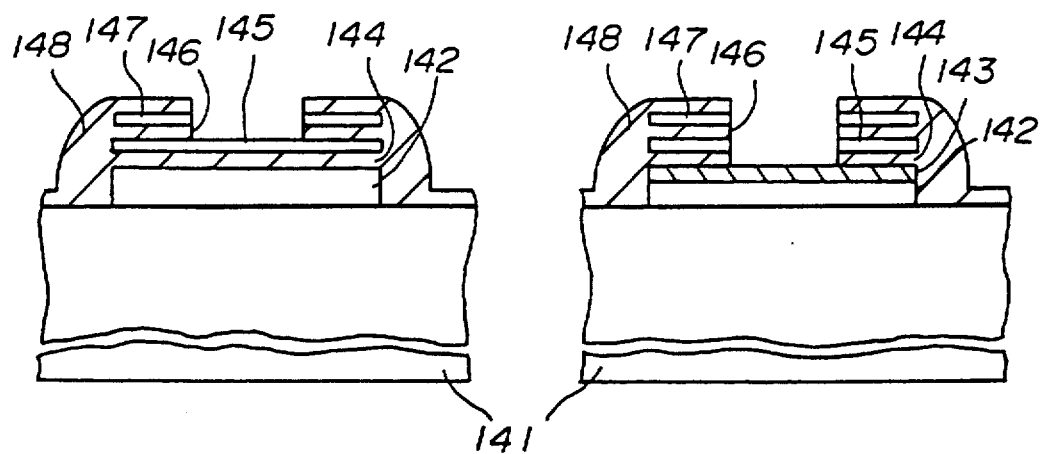

In FIG.11D, a RIE using $CHF_3/He$ as the etching gas is carried out to etch the second insulator layer 146.

However, the thickness of the second insulator layer 146 is already reduced to start with and may not even exist in an extreme case, as described above. Hence, although this etching is originally intended to etch the second insulator layer 146, the third conductor layer 145 and the first insulator layer 144 may be etched to expose the surface of the second conductor layer 143.

Figure 11E:
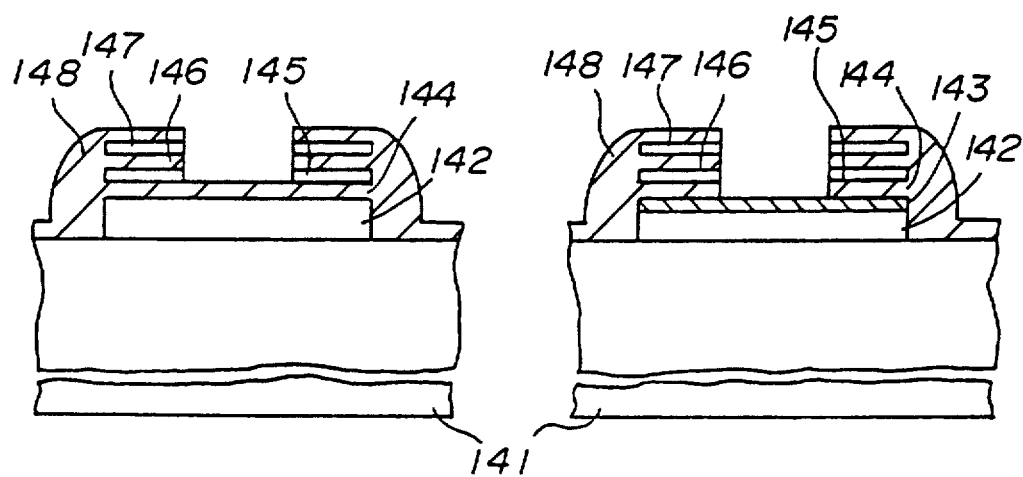

In FIG.11E, a RIE using HBr/Ar as the etching gas is carried out to etch the third conductor layer 145.

Even though the surface of the second conductor layer 143 may already be exposed as described above when this etching is carried out, the second conductor layer 143 is made of the refractory metal or refractory metal silicide. For this reason, the second conductor layer 143 is hardly etched by this RIE which uses HBr, and no problems will be introduced by this RIE.

Figure 11F:
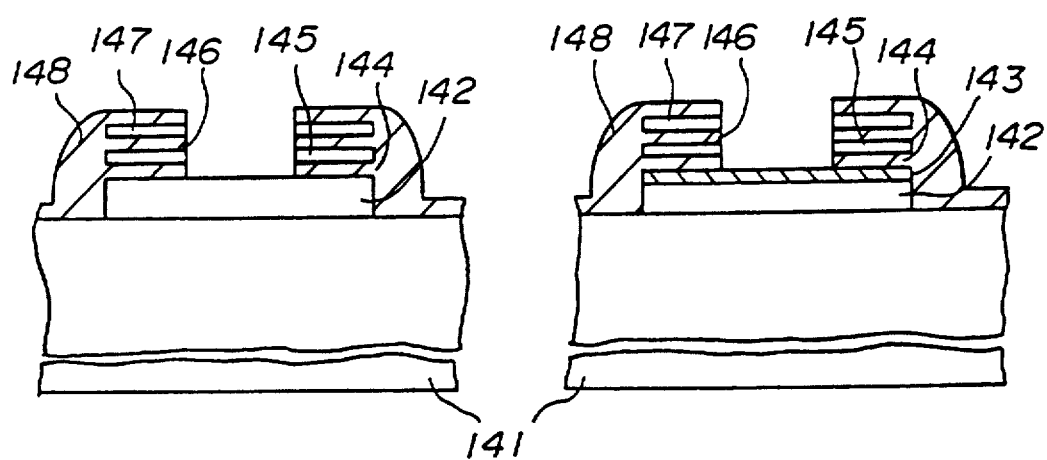

In FIG.11F, a RIE using $CHF_3/He$ as the etching gas is carried out to etch the first insulator layer 144.

The first insulator layer 144 may already be etched when this etching is started, but no adverse effects are introduced because the second conductor layer 143 is made of the refractory metal or refractory metal silicide and is hardly etched by the $CHF_3/He$ etching gas.

Therefore, the contact hole is formed to an ideal shape. The only difference of the resulting contact hole shown in FIG.11F with that shown in FIG.10F is that the lowermost conductor layer in FIG.11F is made up of the first conductor layer 142 and the second conductor layer 143.

Next, a more detailed description will be given of the third embodiment of the semiconductor memory device according to the present invention and the third embodiment of the method of producing the semiconductor memory device according to the present invention, by referring to FIGS.12A through 12H. FIGS.12A through 12H are side views in cross section showing an essential part of the third embodiment of the semiconductor memory device according to the present invention at essential stages of the third embodiment of the method of producing the semiconductor memory device according to the present invention. In this embodiment, the present invention is applied to the TFT load type SRAM.

In FIGS.12A through 12H, those parts which are the same as those corresponding parts in FIGS.1A through 1F and FIGS.4A through 4D are designated by the same reference numerals, and a description thereof will be omitted. In this embodiment of the method, the processes are the same as those of the prior art method up to the processes shown in FIGS.1A through 1F, that is, until the gate insulator layer 3 is selectively etched to form the contact hole 3A. Hence, a description will only be given of the processes carried out thereafter. In the following description, the prior art processes described with reference to FIGS.4A through 4D will help the understanding of this embodiment.

Figure 12A:
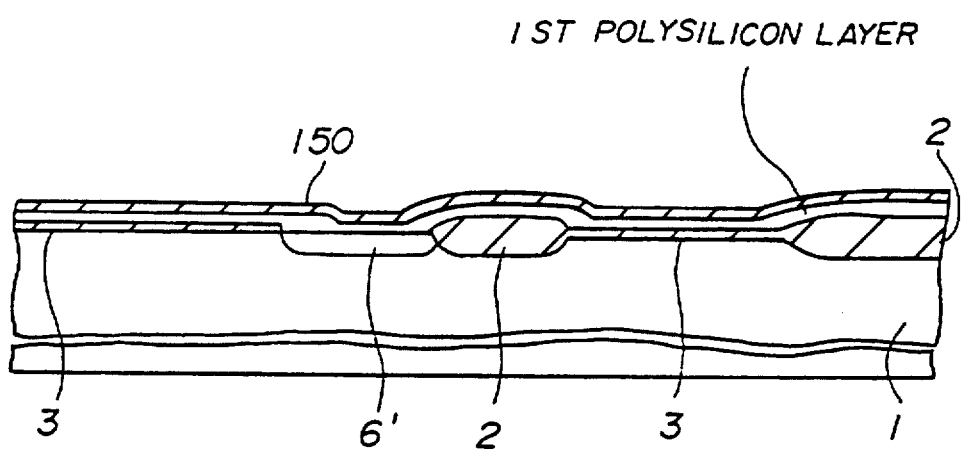

In FIG.12A, it is assumed that the field insulator layer 2, the gate insulator layer 3 and the contact hole 3A are already formed on the Si semiconductor substrate 1.

A CVD is carried out to form a first polysilicon layer having a thickness of 1000 Å, for example. This first polysilicon layer corresponds to the first conductor layer.

By carrying out a vapor phase diffusion, P is introduced with an impurity concentration of $1 \times 10^{21}$ cm$^{-3}$ to form an n$^+$-type impurity region 5'.

A CVD is carried out to form a WSi layer 150 having a thickness of 1000 Å, for example. This WSi layer 150 corresponds to the second conductor layer. The material used for the layer 150 is not limited to WSi, but other refractory metals such as W or refractory metal silicides may be used in place of WSi.

Figure 12B:
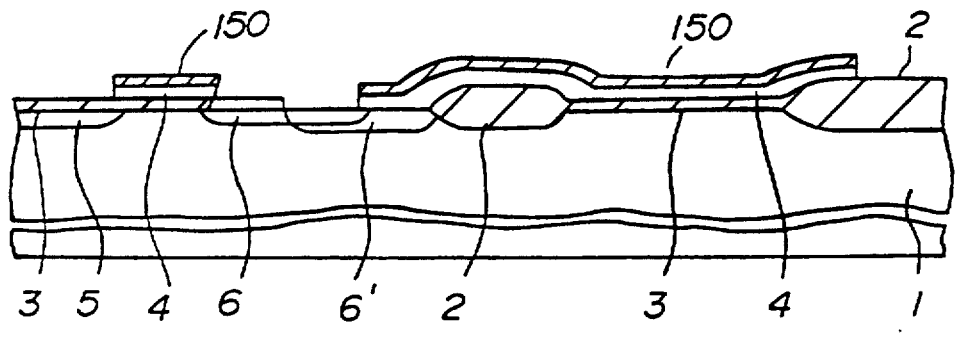

In FIG.12B, a resist process of the photolithography technique and a RIE using $CCl_4/O_2$ as the etching gas for etching WSi and polysilicon are carried out to pattern the WSi layer 150 and the first polysilicon layer and to form a gate electrode 4. This gate electrode 4 is the gate electrode of the driver transistor and the word line.

An ion implantation is carried out to inject As ions with a dosage of $3 \times 10^{15}$ cm$^{-2}$ and an acceleration energy of 40 keV, so as to form a source region 5 and a drain region 6.

Figure 12C:
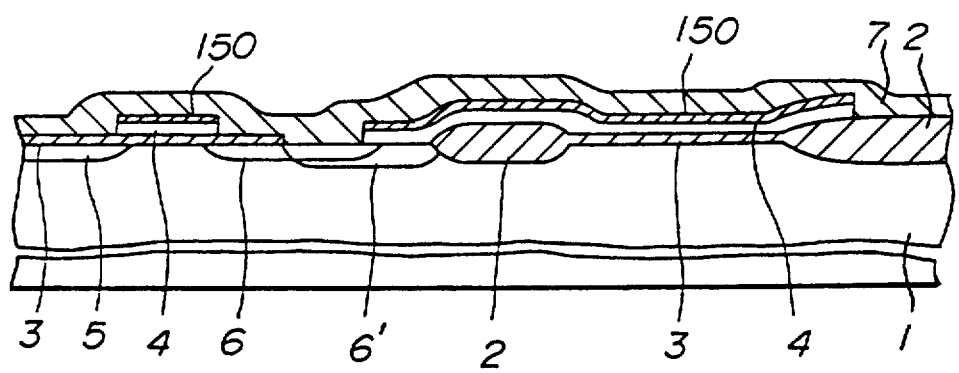

In FIG.12C, a CVD is carried out to form an insulator layer 7 which is made of $SiO_2$ and has a thickness of 1000 Å, for example.

Figure 2A:
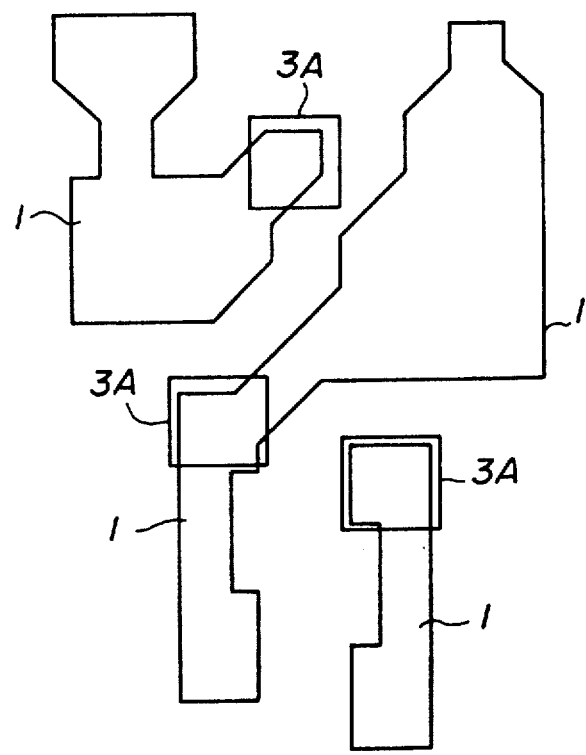
FIGS. 2A through 2F are plan views of the high resistance load type SRAM at essential stages of the conventional method of producing the high resistance load type SRAM.
Figure 2B:
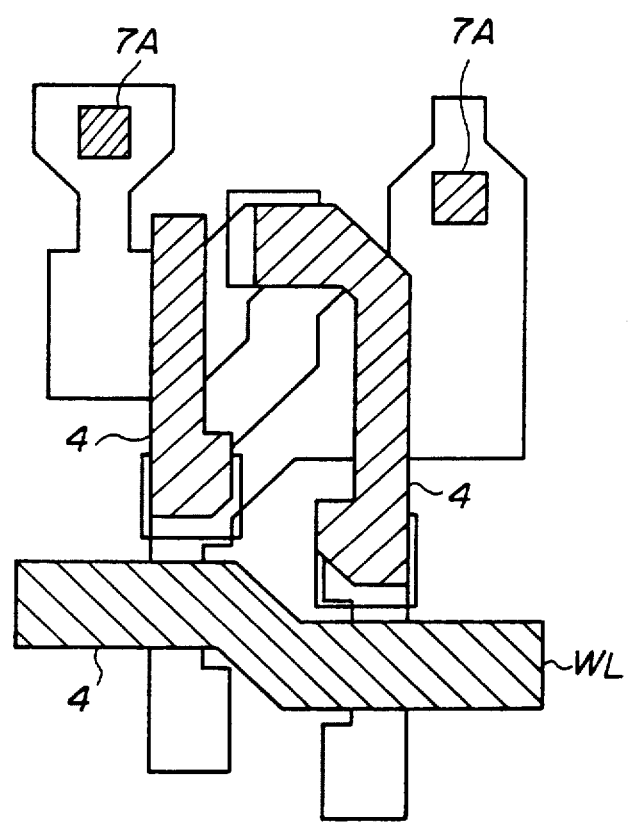
Figure 2C:
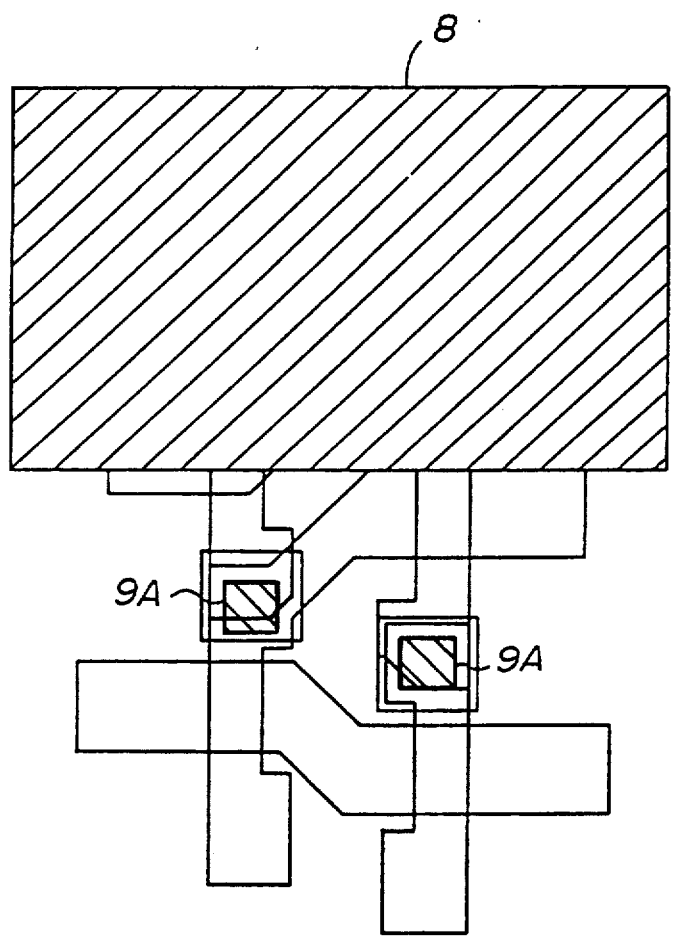
Figure 2D:
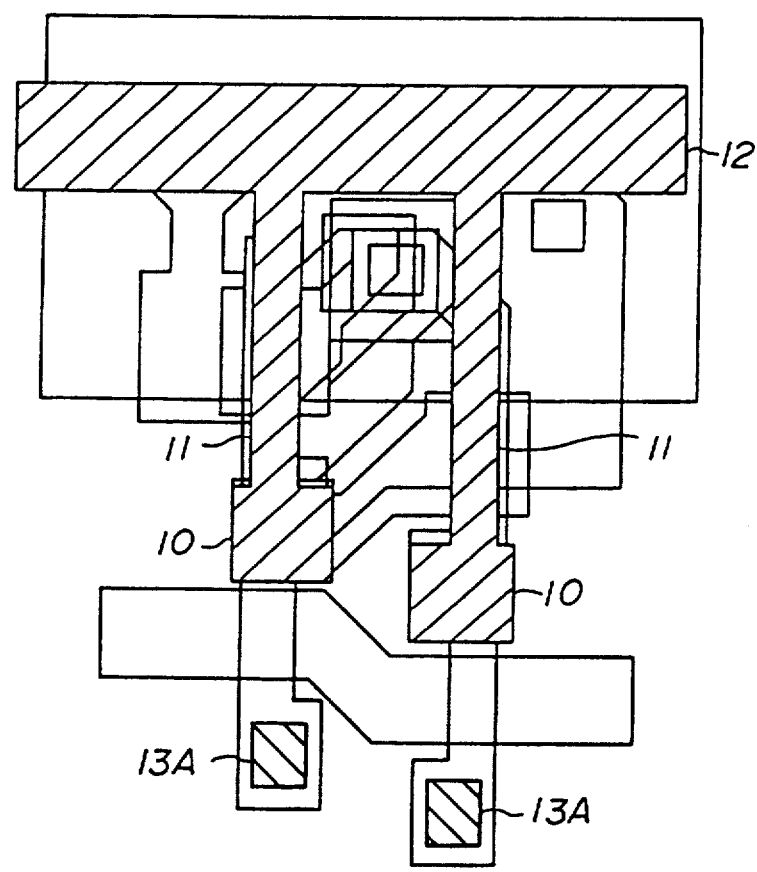
Figure 2E:
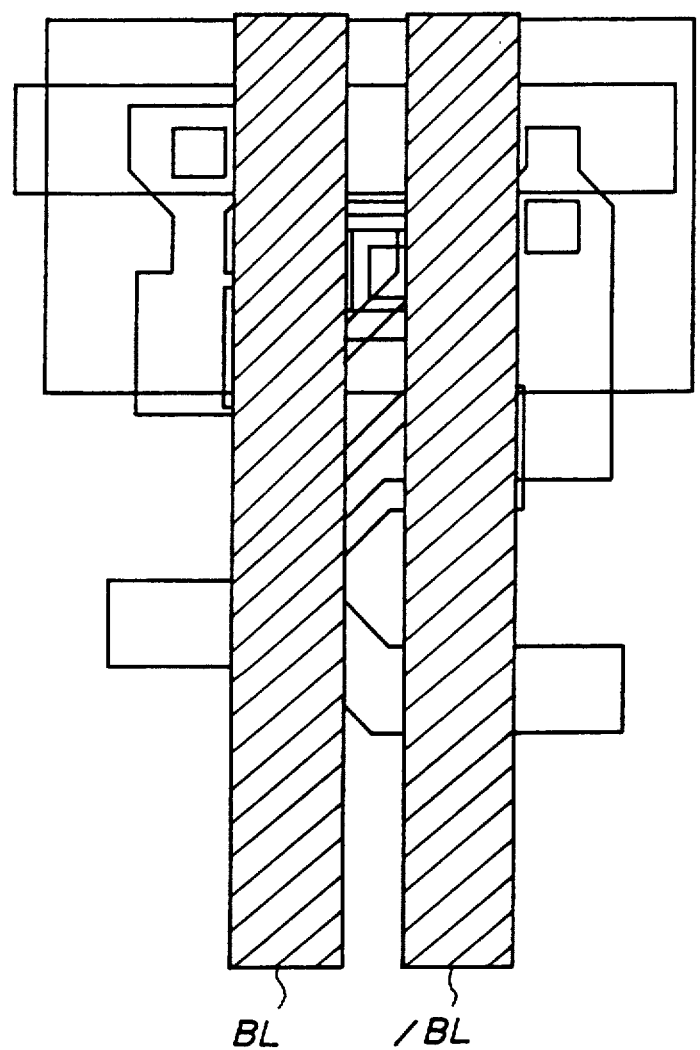

A resist process of the photolithography technique and a RIE using $CHF_3/He$ as the etching gas are carried out to form a ground line contact hole. This ground line contact hole cannot be shown in FIG.12C, but this ground line contact hole may be understood from FIG.2B, for example.

In FIG.12D, a CVD is carried out to form a second polysilicon layer which has a thickness of 1500 Å, for example.

In addition, an ion implantation is carried out to inject P ions into the second polysilicon layer.

A resist process of the photolithography technique and a RIE using $CCl_4/O_2$ as the etching gas are carried out to pattern the second polysilicon layer and to form a ground line 8.

In FIG.12E, a CVD is carried out to form an insulator layer 9 which is made of $SiO_2$ and has a thickness of 1000 Å, for example, on the entire top surface of the stacked structure shown in FIG.12D.

A CVD is carried out to form a third polysilicon layer which has a thickness of 500 Å, for example.

An ion implantation is carried out to inject P ions with a dosage of $1 \times 10^{15}$ cm$^{-2}$ and an acceleration energy of 10 keV.

A resist process of the photolithography technique and a RIE using $CCl_4/O_2$ as the etching gas are carried out to pattern the third polysilicon layer and to form a gate electrode 15 of the TFT.

In FIG.12F, a CVD is carried out to form a gate insulator layer 16 which is made of $SiO_2$ and has a thickness of 200 Å, for example.

A resist process of the photolithography technique and RIEs using $CHF_3/He$ and HBr/Ar as the etching gases for respectively etching $SiO_2$ and polysilicon are carried out, to selectively etch the gate insulator layer 16, the gate electrode 15 which is made of the third polysilicon layer, the insulator layer 9 and the insulator layer 7, and to form a contact hole 16A. This contact hole 16A extends from the surface of the gate insulator layer 16 and reaches the gate electrode 4 of the driver transistor. This process forms an essential part of this embodiment. Even if a sufficient over-etching is carried out so that no etching residue remains within the contact hole 16A after the etching, no adverse damage is made to the surface of the underlying WSi layer 150 which forms the surface of the gate electrode 4. Hence, no damage is made to the first polysilicon layer and the surface of the Si semiconductor substrate 1 by this over-etching.

In FIG.12G, a CVD is carried out to form a fourth polysilicon layer having a thickness of 200 Å, for example.

A resist process of the photolithography technique and an ion implantation are carried out to inject B ions with a dosage of $1\times 10^{14}$ cm$^{-2}$ and an acceleration energy of 5 keV into parts where source and drain regions of the TFT are formed.

Figure 2F:
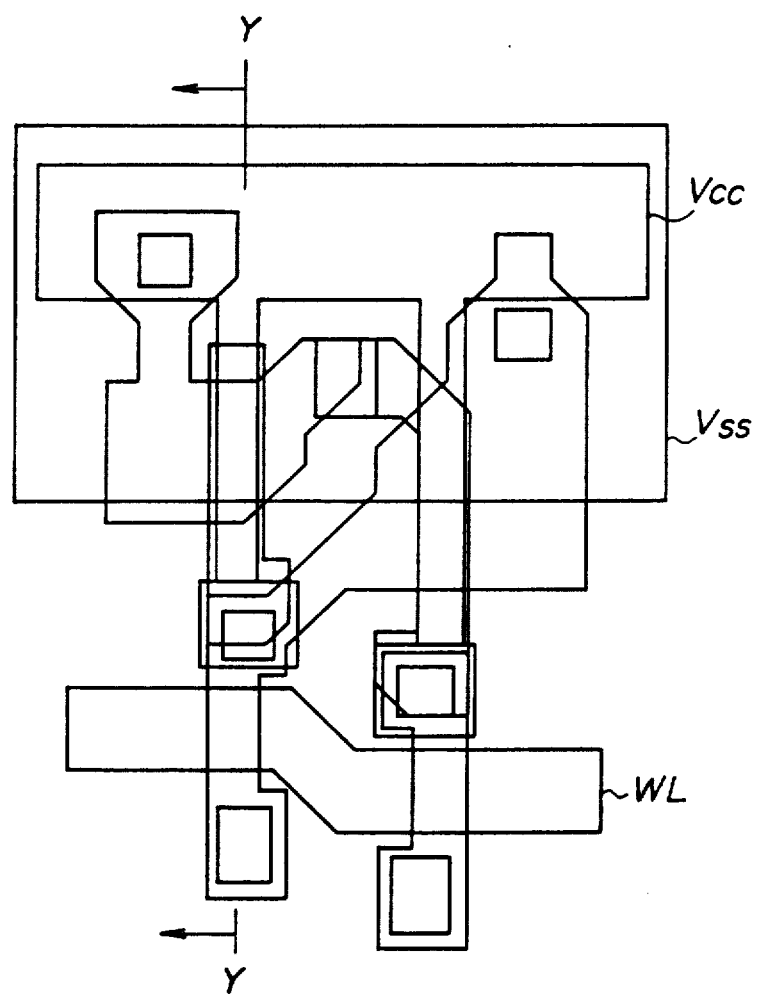
Figure 3:
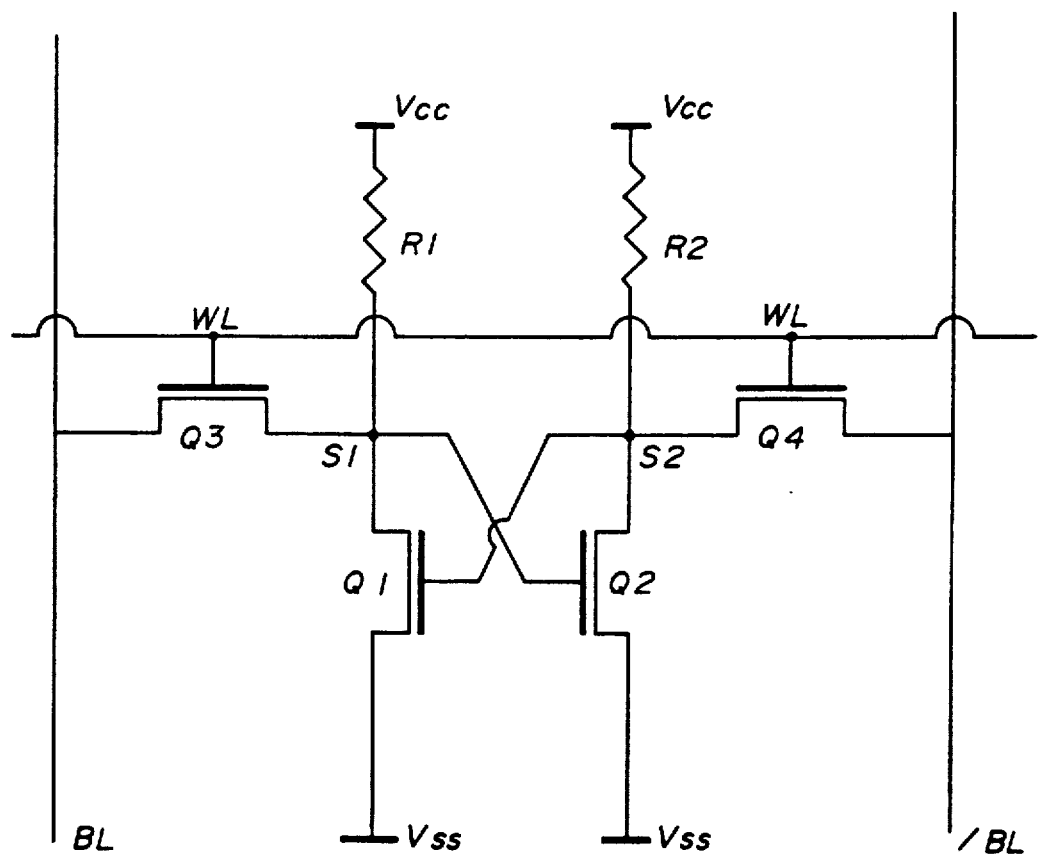
FIG. 3 shows an equivalent circuit diagram of the essential part of the high resistance load type SRAM described in conjunction with FIGS.1A through 1J and 2A through 2F.
Figure 4A:
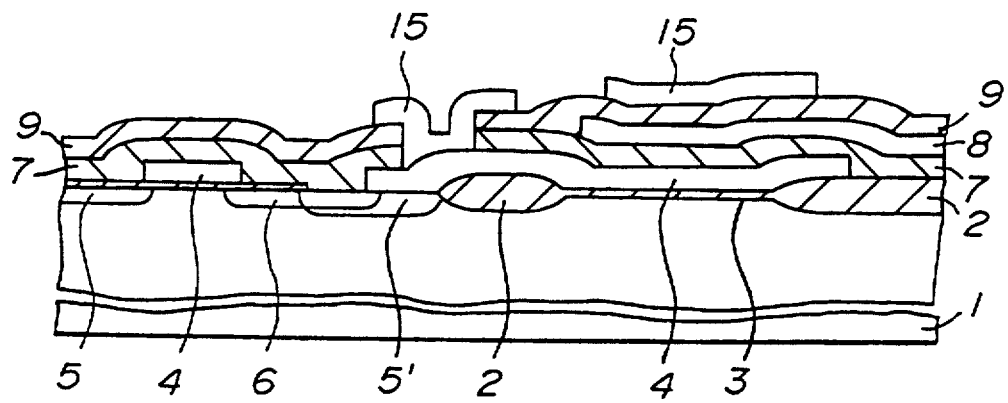
FIGS.4A through 4D are side views in cross section showing essential parts of a TFT load type SRAM at essential stages of a conventional method of producing the TFT load type SRAM.
Figure 4B:
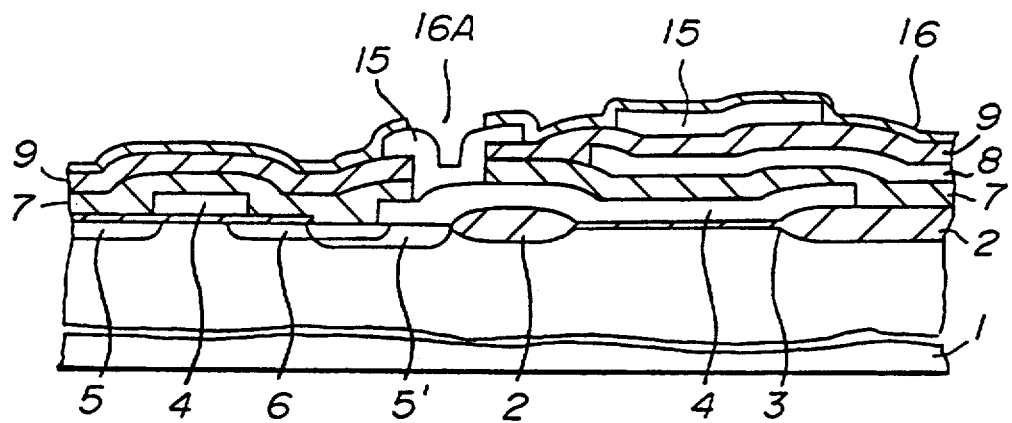
Figure 4C:
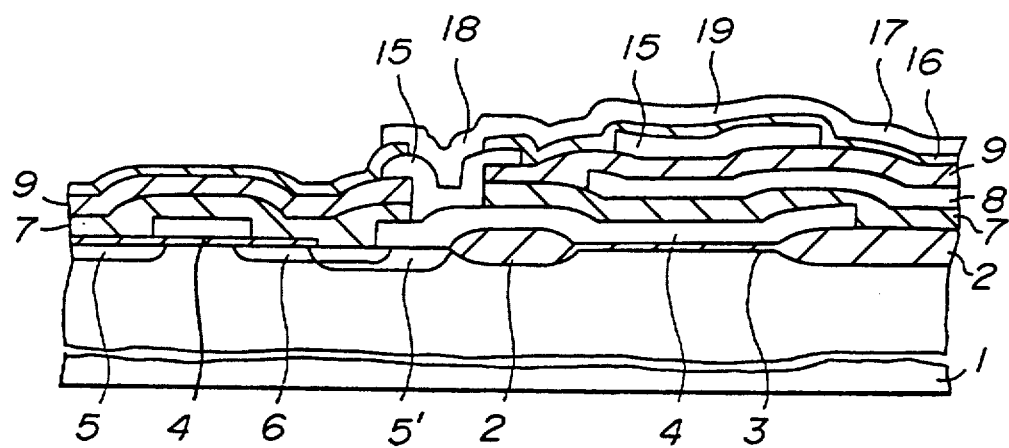
Figure 4D:
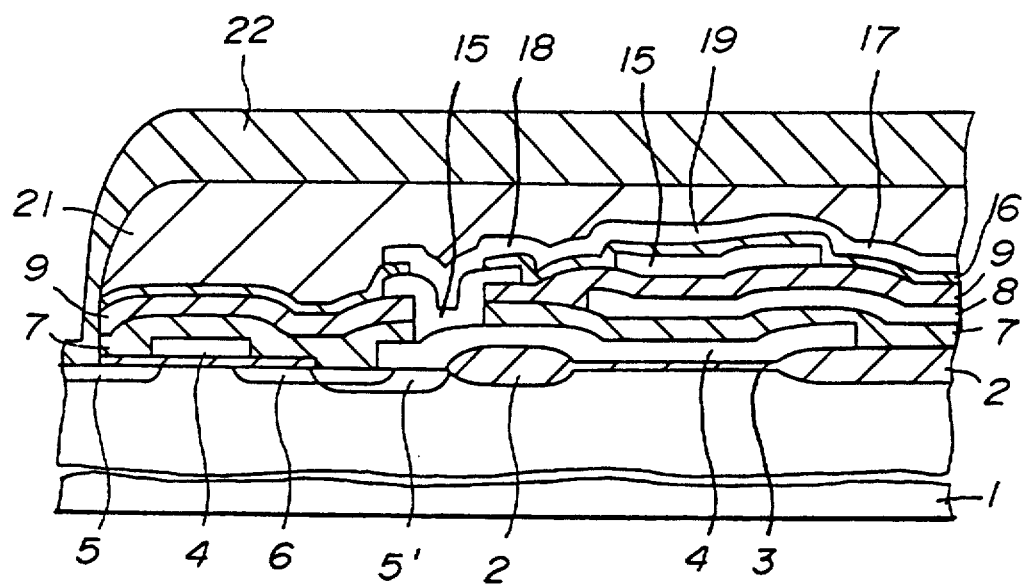
Figure 5A:
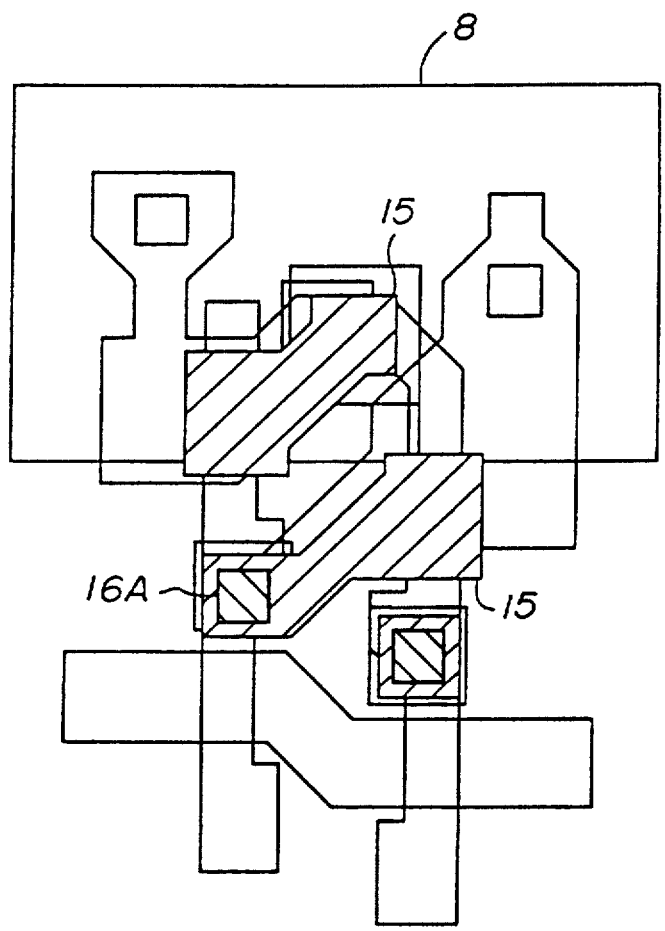
FIGS.5A through 5D are plan views of the TFT load type SRAM at essential stages of the conventional method of producing the TFT load type SRAM.
Figure 5B:
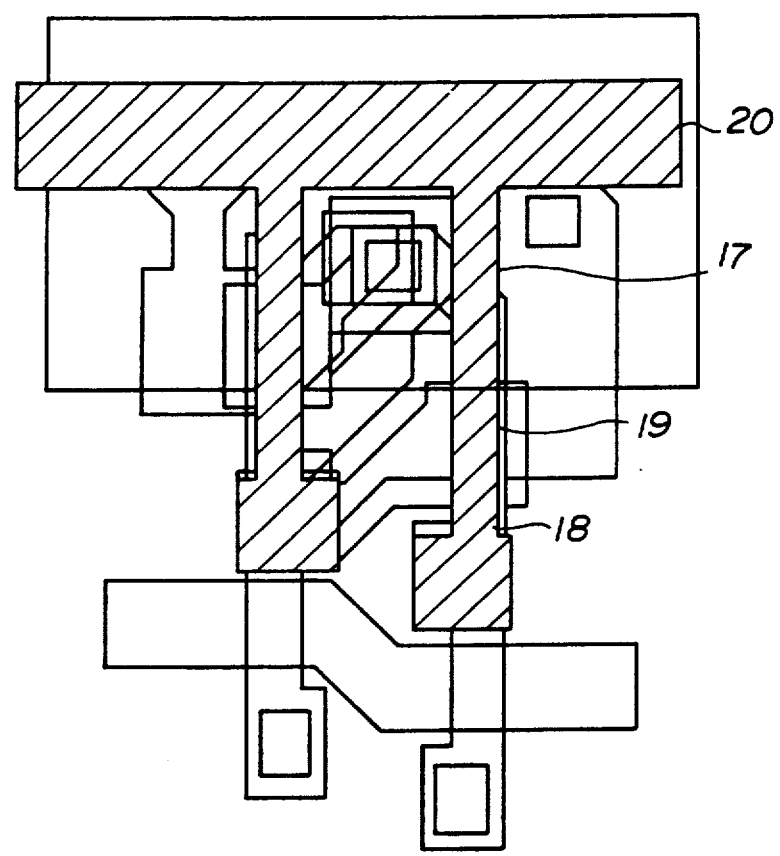
Figure 5C:
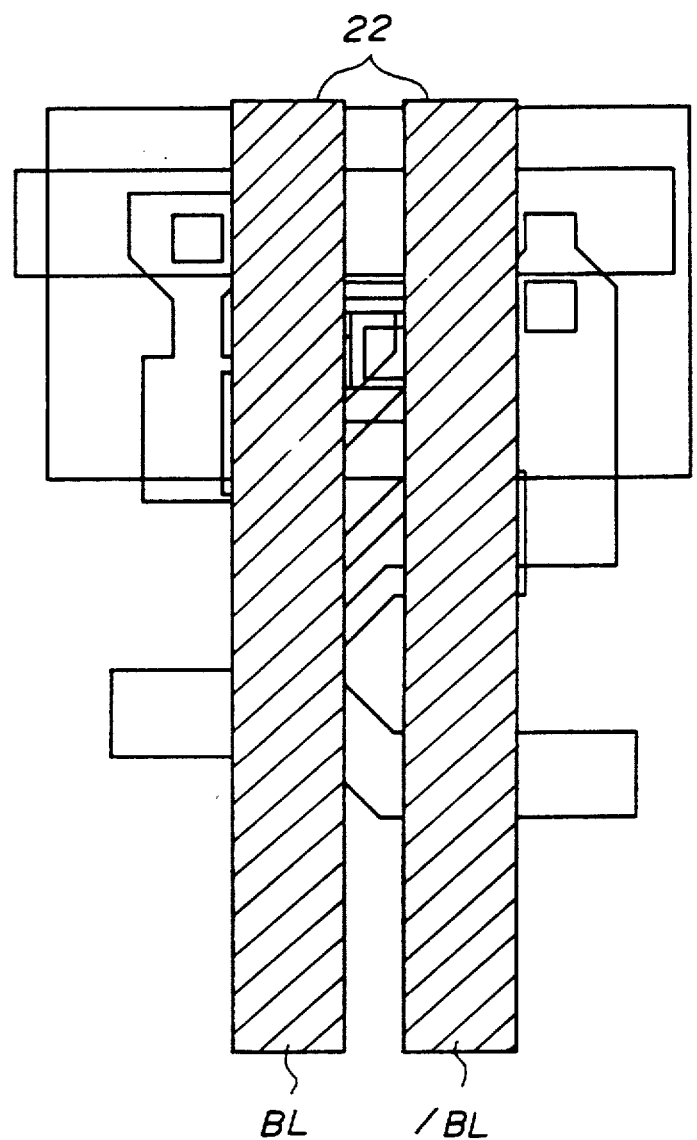
Figure 5D:
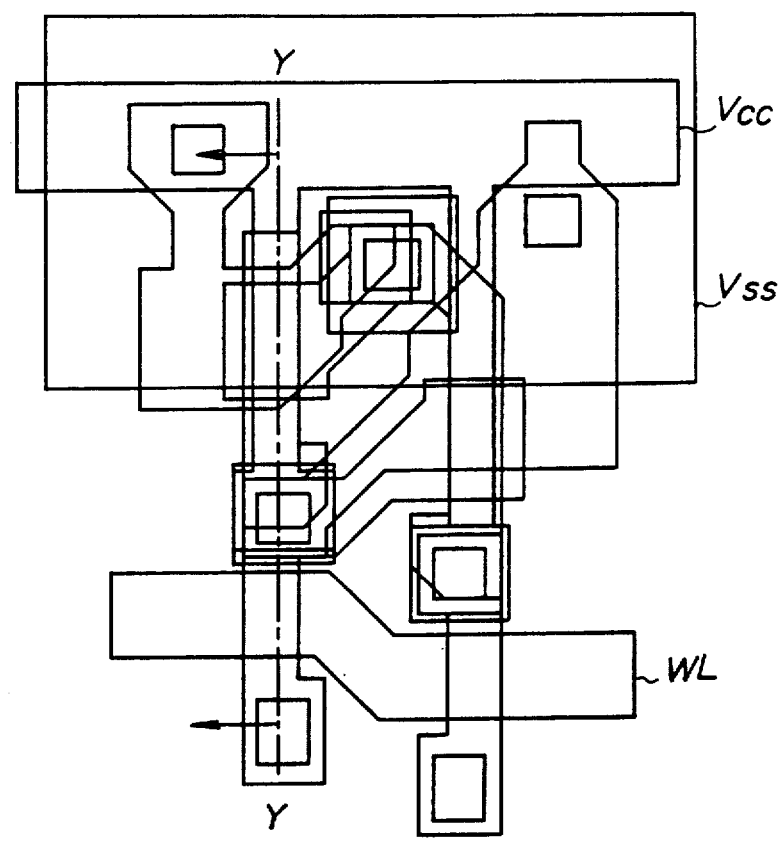
Figure 6:
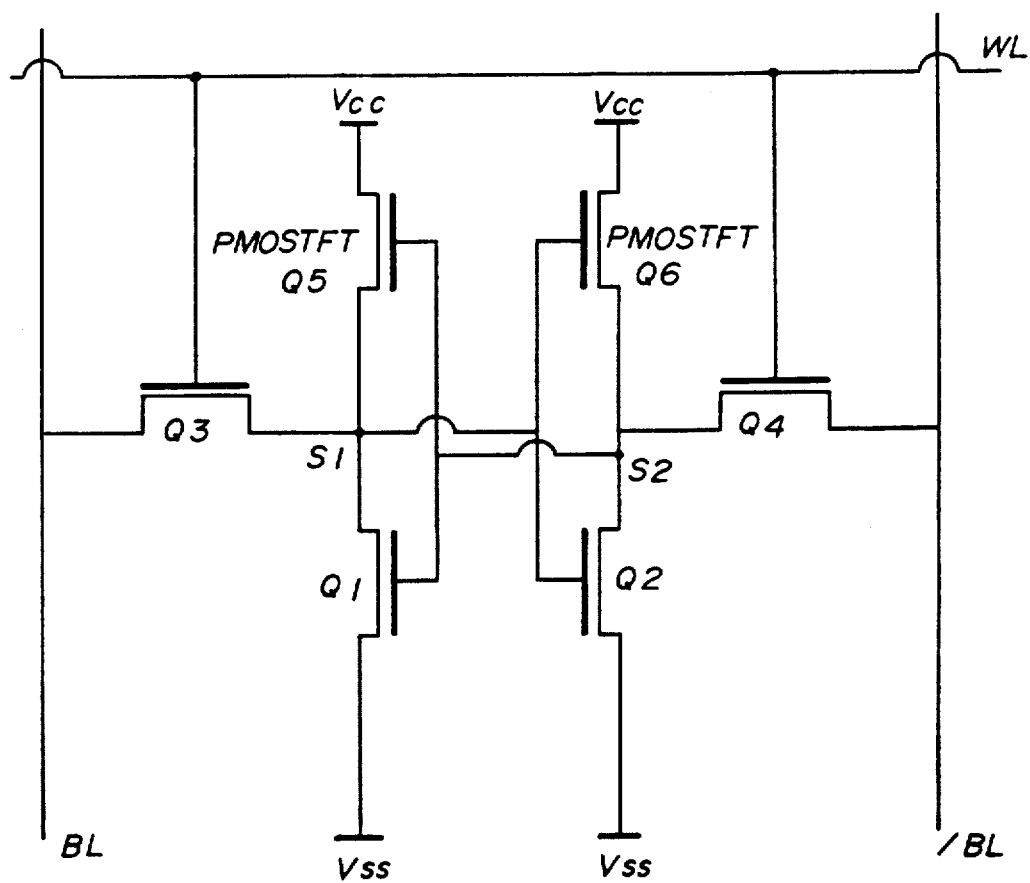
FIG.6 shows an equivalent circuit diagram of an essential part of the TFT load type SRAM described in conjunction with FIGS.4A through 4D and 5A through 5D.

A resist process of the photolithography technique and a RIE using CCl$_4$/O$_2$ as the etching gas are carried out to pattern the fourth polysilicon layer and to form a source region 17, a drain region 18 and a channel region 19 of the TFT, a Vcc supply line and the like. The Vcc supply line cannot be shown in FIG.12G, but the Vcc supply line may be understood from FIG.2F or 5D.

In FIG.12H, a CVD is carried out to form an insulator layer which is made of SiO$_2$ and has a thickness of 1000 Å, for example, and an insulator layer which is made of PSG and has a thickness of 5000 Å. In FIG.12H, these two insulator layers are shown as one insulator layer 21 in FIG.12H, similarly as in the case of FIG.4D.

Then, a thermal process is carried out to reflow and planarize the insulator layer 21.

A resist process of the photolithography technique and a RIE using CHF$_3$/He as the etching gas are carried out to selectively etch the insulator layer 21 and to form a bit line contact hole.

A sputtering is carried out thereafter to form an Al layer having a thickness of 1 μm, for example, and this Al layer is patterned using the normal photolithography technique so as to form a bit line 22.

According to this embodiment described with reference to FIGS.12A through 12H in particular, only one mask process is required to achieve contact of the gate electrode of the driver transistor, the gate electrode of the TFT load and the drain of the TFT load. In addition, when forming the contact hole for achieving this contact, there is no possibility of the underlayer and the substrate from becoming damaged and the characteristic of the memory cell from deteriorating even when the over-etching is carried out to generate no etching residue within the contact hole. On the other hand, in the prior art shown in FIGS.4 and 5, two mask processes are required to achieve the above described contact.

Next, a description will be given of a fourth embodiment of the semiconductor memory device according to the present invention and a fourth embodiment of the method of producing the semiconductor memory device according to the present invention, by referring to FIGS.13A through 13D. FIGS.13A through 13D are side views in cross section showing an essential part of the fourth embodiment of the semiconductor memory device according to the present invention at essential stages of the fourth embodiment of the method of producing the semiconductor memory device according to the present invention. In this embodiment, the present invention is applied to the double gate structure TFT load type SRAM.

In FIGS.13A through 13D, those parts which are the same as those corresponding parts in FIGS.12A through 12H are designated by the same reference numerals, and a description thereof will be omitted. In this embodiment of the method, the processes are the same as those of the third embodiment of the method up to the processes shown in FIGS.12A through 12E, that is, until the gate electrode 15 of the TFT is formed from the third polysilicon layer. Hence, a description will only be given of the processes carried out thereafter. In the following description, the prior art processes described with reference to FIGS.7A through 7C will help the understanding of this embodiment.

In FIG.13A, a double gate structure TFT load type SRAM includes a Si semiconductor substrate 1, a field insulator layer 2 formed on the Si semiconductor substrate 1, a gate insulator layer 3, a gate electrode 4 of the driver transistor which is made up of the first polysilicon layer and a WSi layer 150 (second conductor layer), an n$^+$-type source region 5, an n$^+$-type drain region 6, an n$^+$-type diffusion region 6′, an insulator layer 7, a ground line 8 which is made up of the second polysilicon layer, a lower gate electrode 15 of the TFT, and a gate insulator layer 16 of the TFT.

A CVD is carried out to form a fourth polysilicon layer which has a thickness of 200 Å, for example.

A resist process of the photolithography technique and an ion implantation are carried out to inject B ions with a dosage of $1\times 10^{14}$ cm$^{-2}$ and an acceleration energy of 5 keV into parts where source and drain regions of the TFT are formed.

A resist process of the photolithography technique and a RIE using CCl$_4$/O$_2$ as the etching gas are carried out to pattern the fourth polysilicon layer and to form a source region 17, a drain region 18 and a channel region 19 of the TFT and a Vcc supply line. The Vcc supply cannot be seen in FIG.13A.

In FIG.13B, a CVD is carried out to form an insulator layer 23 which is made of SiO$_2$ and has a thickness of 500 Å, for example.

A resist process of the photolithography technique and RIEs using CHF$_3$/He and HBr/Ar as the etching gases for respectively etching SiO$_2$ and polysilicon are carried out to selectively etch the insulator layer 23, the drain region 18 of the TFT formed from the fourth polysilicon layer, the gate insulator layer 16, the gate electrode 15 which is formed from the third polysilicon layer, the insulator layer 9 and the insulator layer 7, and to form a contact hole 23A. This contact hole 23A extends from the surface of the insulator layer 23 and reaches the gate electrode 4 of the driver transistor. The gate electrode 4 is made up of the WSi layer 150 and the first polysilicon layer. This process forms an essential part of this embodiment.

In FIG.13C, a CVD is carried out to form a fifth polysilicon layer which has a thickness of 500 Å, for example.

Then, a thermal diffusion is carried out to diffuse P into the fifth polysilicon layer with an impurity concentration of $1\times 10^{21}$ cm$^{-3}$, for example.

A resist process of the photolithography technique and a RIE using CCl$_4$/O$_2$ as the etching gas are carried out to pattern the fifth polysilicon layer and to form an upper gate electrode 24 of the TFT.

In FIG.13D, a CVD is carried out to form an insulator layer which is made of SiOhd 2 and has a thickness of 1000 Å, for example, and an insulator layer which is made of PSG and has a thickness of 5000 Å, for example. In FIG.13D, these two insulator layers are shown as one insulator layer 25.

Thereafter, a thermal process is carried out to reflow and planarize the insulator layer 25.

A resist process of the photolithography technique and a RIE using $CHF_3$/He as the etching gas are carried out to selectively etch the insulator layer 25 and the like and to form a bit line contact hole.

Next, a sputtering is carried out to form an Al layer having a thickness of 1 µm, for example, and this Al layer is patterned using the normal photolithography technique so as to form a bit line 26.

In this embodiment, the concept shown in FIGS.11A through 11F is applied to the double gate structure TFT load type SRAM. When forming the contact hole for achieving the necessary contact, there is no possibility of the underlayer and the substrate from becoming damaged and the characteristic of the memory cell from deteriorating even when the over-etching is carried out to generate no etching residue within the contact hole. Compared to the prior art method described with reference to FIGS.7A through 7C, the number of mask processes which are required to achieve the above described contact in this embodiment is reduced by two.

Further, the present invention is not limited to these embodiments, but various variations and modifications may be made without departing from the scope of the present invention.

What is claimed is:

1. A semiconductor memory device comprising:
   a semiconductor substrate;
   a memory cell provided on the semiconductor substrate and including first and second transfer transistors, first and second driver transistors and first and second thin film transistor loads, each of said first and second transfer transistors, said first and second driver transistors and said first and second thin film transistor loads having a source, a drain and a gate electrode;
   a connection region in which the drain of the second thin film transistor load, the gate electrode of the first thin film transistor load and the gate electrode of the first driver transistor are electrically connected;
   the gate electrode of the first driver transistor, the gate electrode of the first thin film transistor load and the drain of the second thin film transistor load being made of conductor layers which are stacked in succession on said semiconductor substrate, a respective insulator layer being interposed between each two successively stacked conductor layers and thereby defining a bottom conductor layer and successive, intermediate and top conductor layers with respective insulation layers interposed therebetween; and
   a surface portion of the bottom conductor layer being exposed in the connecting region and at least transverse wall surfaces of each intermediate conductor layer being exposed within the connecting region and the top conductor layer being connected electrically within, and by, the connecting region with the exposed top surface portion of the bottom stacked conductor layer and primarily with the respective transverse wall surfaces of the intermediate, stacked conductor layers.

2. The semiconductor memory device as claimed in claim 1, wherein the top conductor layer forms the drain of the second thin film transistor load, the bottom conductor layer forms the gate electrode of the first driver transistor, and an intermediate conductor layer, between the top and bottom conductor layers, forms the gate electrode of the first thin film transistor load.

3. The semiconductor memory device as claimed in claim 2, wherein at least the intermediate conductor layers are made of polysilicon, and the insulator layers are made of $SiO_2$.

4. The semiconductor memory device as claimed in claim 3, wherein the bottom conductor layer comprises a first layer formed on said semiconductor substrate and a second layer formed on the first layer, said second layer being made of a material selected from the group consisting of refractory metals and refractory metal silicides.

5. The semiconductor memory device as claimed in claim 2, wherein the drain of the second driver transistor is further connected to the gate electrode of the first driver transistor, the gate electrode of the first thin film transistor load and the drain of the second thin film transistor load by said connecting region.

6. The semiconductor memory device as claimed in claim 1, wherein the first thin film transistor load has a channel region, and the gate electrode of the first thin film transistor load is made up of a lower gate electrode, which is formed under the channel region and separated therefrom by a respective, said interposed insulator layer, and an upper gate electrode, which is formed above the channel region and separated therefrom by a respective, said interposed insulator layer.

7. The semiconductor memory device as claimed in claim 6, wherein the top conductor layer forms the upper gate electrode of the first thin film transistor load, the bottom conductor layer forms the gate electrode of the first driver transistor, and the conductor layers provided between the top and bottom conductor layers respectively form the drain of the second thin film transistor load and the lower gate electrode of the first thin film transistor load.

8. The semiconductor memory device as claimed in claim 7, wherein at least each intermediate conductor layer is made of polysilicon and the insulator layers are made of $SiO_2$.

9. The semiconductor memory device as claimed in claim 8, wherein the bottom conductor layer comprises a first layer formed on said semiconductor substrate and a second layer formed on the first layer, said second layer being made of a material selected from the group consisting of refractory metals and refractory metal silicides.

10. The semiconductor memory device as claimed in claim 7, wherein the drain of the second driver transistor is further connected to the gate electrode of the first driver transistor, the gate electrode of the first thin film transistor load and the drain of the second thin film transistor load by said connecting region.

11. A semiconductor memory device comprising:
    a semiconductor substrate;
    a memory cell provided on the semiconductor substrate and including first and second transfer transistors, first and second driver transistors and first and second thin film transistor loads, each of said first and second transfer transistors, said first and second driver transistors and said first and second thin film transistor loads having a source, a drain and a gate electrode;
    a connection region in which the drain of the second thin film transistor load, the gate electrode of the first thin film transistor load and the gate electrode of the first driver transistor are electrically connected;

the gate electrode of the first driver transistor, the gate electrode of the first thin film transistor load and the drain of the second thin film transistor load being made of conductor layers which are stacked in succession on said semiconductor substrate and a respective insulator layer is interposed between each two successive stacked conductor layers and thereby defining a bottom conductor layer and successive, intermediate and top conductor layers with respective insulation layers interposed therebetween; and the connecting region further comprising:

a contact window extending through the successively stacked top and intermediate conductor layers and each interposed insulator layer and exposing a surface portion of the bottom conductor layer, respective transverse wall surfaces of the stacked conductor layers and interposed insulator layers being exposed at and defining corresponding sidewalls of the contact hole, the respective transverse wall surfaces of the stacked conductor layers and the interposed insulator layers, corresponding to each sidewall of the contact hole, being substantially aligned, and a conductor material formed within and covering at least the sidewalls of the contact window and the exposed top surface portion of the bottom conductor layer, the conductor material being formed on at least the exposed transverse wall surfaces of the respective conductor layers and electrically connecting the top conductor layer with the intermediate conductor layers and the bottom layer.

12. The semiconductor memory device as claimed in claim 11, wherein the top conductor layer forms the drain of the second thin film transistor load, the bottom conductor layer forms the gate electrode of the first driver transistor, and an intermediate conductor layer, between the top and bottom conductor layers, forms the gate electrode of the first thin film transistor load.

13. The semiconductor memory device as claimed in claim 12, wherein at least the intermediate conductor layers are made of polysilicon and the insulator layers are made of SiO$_2$.

14. The semiconductor memory device as claimed in claim 13, wherein the bottom conductor layer comprises a first layer formed on said semiconductor substrate and a second layer formed on the first layer, said second layer being made of a material selected from the group consisting of refractory metals and refractory metal silicides.

15. The semiconductor memory device as claimed in claim 12, wherein the drain of the second driver transistor is further connected to the gate electrode of the first driver transistor, the gate electrode of the first thin film transistor load and the drain of the second thin film transistor load by said connecting region.

16. The semiconductor memory device as claimed in claim 11, wherein the first thin film transistor load has a channel region, and the gate electrode of the first thin film transistor load is made up of a lower gate electrode, which is formed under the channel region and separated therefrom by a respective, said interposed insulator layer, and an upper gate electrode, which is formed above the channel region and separated therefrom by a respective, said interposed insulator layer.

17. The semiconductor memory device as claimed in claim 16, wherein the top conductor layer forms the upper gate electrode of the first thin film transistor load, the bottom conductor layer forms the gate electrode of the first driver transistor, and the conductor layers provided between the top and bottom conductor layers respectively form the drain of the second thin film transistor load and the lower gate electrode of the first thin film transistor load.

18. The semiconductor memory device as claimed in claim 7, wherein at least each intermediate conductor layer is made of polysilicon and the insulator layers are made of SiO$_2$.

19. The semiconductor memory device as claimed in claim 8, wherein the bottom conductor layer comprises a first layer formed on said semiconductor substrate and a second layer formed on the first layer, said second layer being made of a material selected from the group consisting of refractory metals and refractory metal silicides.

20. The semiconductor memory device as claimed in claim 7, wherein the drain of the second driver transistor is further connected to the gate electrode of the first driver transistor, the gate electrode of the first thin film transistor load and the drain of the second thin film transistor load by said connecting region.

21. The semiconductor memory device as recited in claim 18, wherein the transverse wall surfaces of the conductor layers protrude inwardly of the transverse wall surfaces of the corresponding insulator layers at each sidewall of the contact hole, the conductor material, further, being formed on and connected to the protruding surfaces of the intermediate conductor layers.

* * * * *

UNITED STATES PATENT AND TRADEMARK OFFICE
CERTIFICATE OF CORRECTION

PATENT NO. : 5,327,003
DATED : July 5, 1994
INVENTOR(S) : ITABASHI et al.

It is certified that error appears in the above-indentified patent and that said Letters Patent is hereby corrected as shown below:

TITLE PAGE: [56] under FOREIGN PATENT DOCUMENTS, line 4, change "1-1446556" to --1-144655--.

Col. 3, line 16, change "BL" (second occurrence) to --/BL--.

Col. 18, line 66, change "SiOhd 2" to --$SiO_2$--.

Signed and Sealed this

Twenty-ninth Day of November, 1994

Attest:

BRUCE LEHMAN

*Attesting Officer*   *Commissioner of Patents and Trademarks*